(12) United States Patent
Khoury et al.

(10) Patent No.: US 9,964,326 B2
(45) Date of Patent: May 8, 2018

(54) ELECTROSTATIC DISCHARGE CONNECTOR AND METHOD FOR AN ELECTRONIC DEVICE

(71) Applicant: Honeywell International Inc., Morristown, NJ (US)

(72) Inventors: Tarik Khoury, Brno (CZ); Steven J. McPherson, Richfield, MN (US); Petr Adamik, Jihlava (CZ); Jiri Sapak, Brno (CZ)

(73) Assignee: Honeywell International Inc., Morris Plains, NJ (US)

( * ) Notice: Subject to any disclaimer, the term of this patent is extended or adjusted under 35 U.S.C. 154(b) by 693 days.

(21) Appl. No.: 14/214,335

(22) Filed: Mar. 14, 2014

(65) Prior Publication Data

US 2014/0268452 A1    Sep. 18, 2014

Related U.S. Application Data

(60) Provisional application No. 61/800,637, filed on Mar. 15, 2013.

(51) Int. Cl.
*F24F 11/00* (2006.01)
*H02H 9/04* (2006.01)
(Continued)

(52) U.S. Cl.
CPC ............ *F24F 11/0086* (2013.01); *G01K 7/42* (2013.01); *G02F 1/133308* (2013.01);
(Continued)

(58) Field of Classification Search
CPC ...... H05K 3/32; H05K 1/0254; H05K 9/0064; G02F 1/133308; F24F 11/0086; H05F 3/00–3/02; H02H 9/005; H02H 9/041; H02H 9/044–9/046
See application file for complete search history.

(56) References Cited

U.S. PATENT DOCUMENTS 5,675,396 A    10/1997    Tsunehiro et al.
5,894,399 A    4/1999    Wong et al.
(Continued)

FOREIGN PATENT DOCUMENTS

EP    1793304 A2    6/2007
JP    3303561 B2    7/2002
(Continued)

OTHER PUBLICATIONS

International Search Report for Corresponding Aplication No. PCT/US2014/029716 dated Jun. 24, 2014.
(Continued)

*Primary Examiner* — Thienvu Tran
*Assistant Examiner* — Christopher Clark
(74) *Attorney, Agent, or Firm* — Seager, Tufte & Wickhem, LLP

(57) ABSTRACT

An illustrative electronic assembly having an electrical connector therein to ground an electronic component of the electronic assembly to a grounding feature of a printed wiring assembly (PWA) of the electronic assembly. The electronic assembly may include a housing, the PWA, the electronic component and the electrical connector. The electrical connector may be a conductive and resilient extender or connector that may have a first portion connected to the PWA and a second portion extending generally away from the PWA toward the electronic component. The second portion of the electrical connector may be in mechanical and electrical contact with the electronic component.

16 Claims, 40 Drawing Sheets

(51) Int. Cl.

| | | |
|---|---|---|
| *H05F 3/00* | (2006.01) | |
| *H05K 1/02* | (2006.01) | |
| *H05K 3/32* | (2006.01) | |
| *G05D 23/32* | (2006.01) | |
| *G01K 7/42* | (2006.01) | |
| *H05K 1/11* | (2006.01) | |
| *H01R 4/34* | (2006.01) | |
| *H05K 7/14* | (2006.01) | |
| *H02H 9/00* | (2006.01) | |
| *H05K 5/00* | (2006.01) | |
| *H05K 13/00* | (2006.01) | |
| *G02F 1/1333* | (2006.01) | |
| *H05K 9/00* | (2006.01) | |
| *H02G 3/14* | (2006.01) | |
| *G05D 23/19* | (2006.01) | |

(52) U.S. Cl.
CPC .............. *G05D 23/32* (2013.01); *H01R 4/34* (2013.01); *H02G 3/14* (2013.01); *H02H 9/005* (2013.01); *H02H 9/04* (2013.01); *H05F 3/00* (2013.01); *H05K 1/0254* (2013.01); *H05K 1/111* (2013.01); *H05K 3/32* (2013.01); *H05K 5/0017* (2013.01); *H05K 7/1422* (2013.01); *H05K 7/1427* (2013.01); *H05K 9/0037* (2013.01); *H05K 9/0054* (2013.01); *H05K 13/00* (2013.01); *H05K 13/0015* (2013.01); *F24F 2011/0091* (2013.01); *G02F 2001/133314* (2013.01); *G05D 23/1904* (2013.01); *Y10T 29/49002* (2015.01); *Y10T 29/4913* (2015.01); *Y10T 29/49124* (2015.01); *Y10T 29/49826* (2015.01)

(56) References Cited

U.S. PATENT DOCUMENTS

| | | | | |
|---|---|---|---|---|
| 6,362,860 | B1* | 3/2002 | Sagawa | G02F 1/133308 349/59 |
| 7,301,251 | B2* | 11/2007 | Cara | H05K 9/0039 310/71 |
| 7,508,465 | B2 | 3/2009 | Hung et al. | |
| 8,558,964 | B2* | 10/2013 | Bedingfield | H05K 9/0096 349/59 |
| 8,804,332 | B2* | 8/2014 | Canova, Jr. | G06F 1/1626 361/679.02 |
| 9,310,095 | B2* | 4/2016 | Adamik | H05K 1/111 |
| 2003/0133056 | A1* | 7/2003 | Lai | G02F 1/133308 349/58 |
| 2005/0023904 | A1 | 2/2005 | Cara et al. | |
| 2006/0098134 | A1* | 5/2006 | Park | G02F 1/133308 349/58 |
| 2006/0146486 | A1* | 7/2006 | Wikstrom | G02F 1/133308 361/679.26 |
| 2006/0221583 | A1* | 10/2006 | Su | H05K 9/0067 361/753 |
| 2007/0052100 | A1 | 3/2007 | Bellinger | |
| 2009/0002594 | A1 | 1/2009 | Okumura et al. | |
| 2009/0167615 | A1* | 7/2009 | Teng | H01Q 1/2266 343/702 |
| 2011/0080721 | A1 | 4/2011 | Yukiyoshi | |
| 2012/0176755 | A1* | 7/2012 | Malek | H05K 3/32 361/752 |
| 2012/0205712 | A1* | 8/2012 | Hayashi | B29C 45/0046 257/100 |
| 2012/0268882 | A1 | 10/2012 | McClure et al. | |
| 2013/0105198 | A1* | 5/2013 | Ogawa | H05K 3/32 174/126.2 |
| 2014/0262481 | A1* | 9/2014 | Khoury | H05K 1/111 174/480 |
| 2015/0116159 | A1* | 4/2015 | Chen | H01Q 5/22 343/702 |

FOREIGN PATENT DOCUMENTS

| | | |
|---|---|---|
| JP | 2003015150 A | 1/2003 |
| JP | 2004317919 | 11/2004 |
| JP | 2005209868 A | 8/2005 |

OTHER PUBLICATIONS iFixit, "iPhone 5 Teardown," Dozuki, 14 pages, Downloaded Jan. 13, 2013. http://www.ifixit.com/Teardown/iPhone+5+Teardown/10525/4.

* cited by examiner

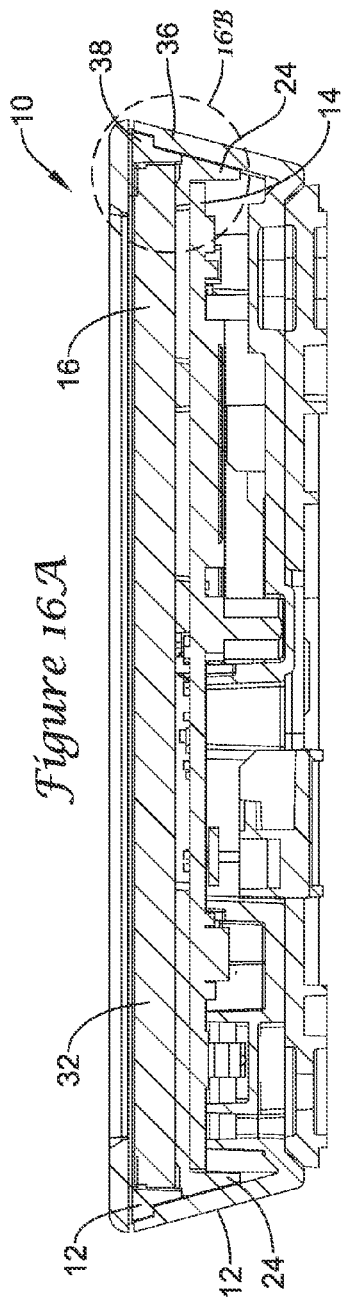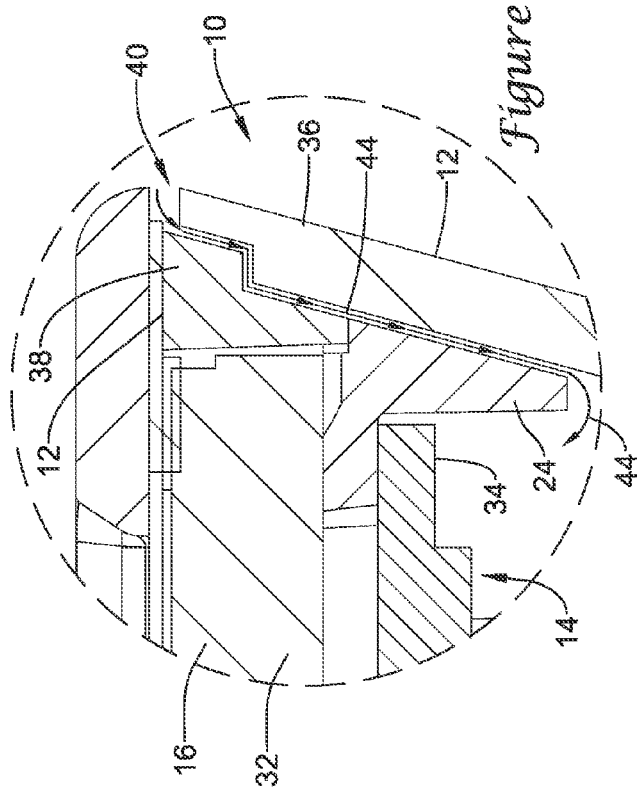

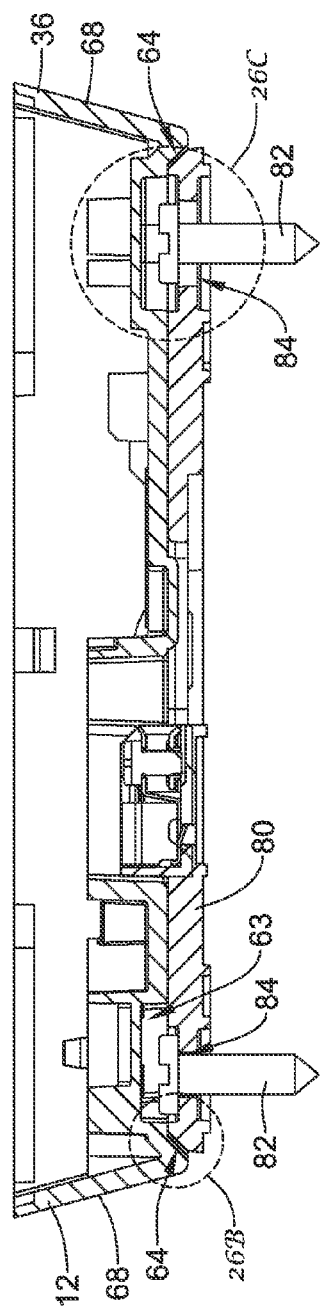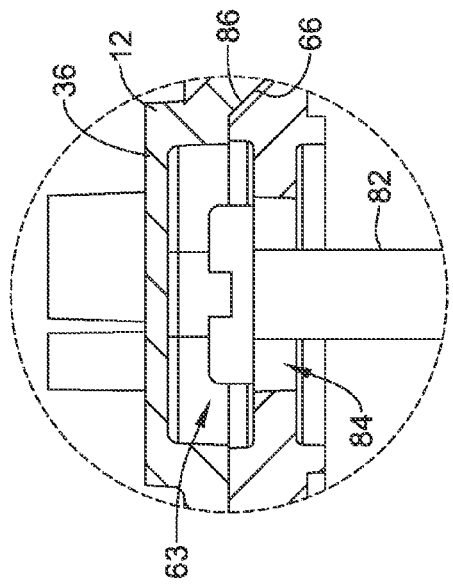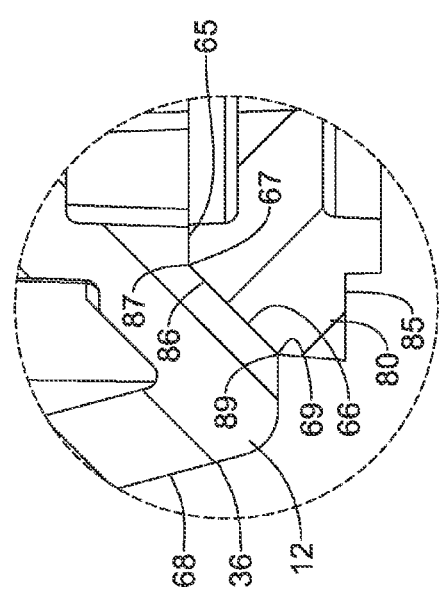

ELECTROSTATIC DISCHARGE CONNECTOR AND METHOD FOR AN ELECTRONIC DEVICE

This application claims priority to U.S. Provisional Application Ser. No. 61/800,637, filed Mar. 15, 2013 and entitled "Electronic Device and Methods", which is incorporated herein by reference.

TECHNICAL FIELD

This disclosure generally relates to electronic devices, and more particularly to improved use, assembly, construction, and reliability of such electronic devices. This disclosure also relates to devices for protecting electrical components, and more particularly, to methods and devices for helping to protect electrical components from ESD events.

BACKGROUND

Many electronic devices include one or more components that are manually operated by a user, such as touch screen displays and/or other manually operated switches or buttons. Such electronic devices include, for example, mobile phones, tablet computers, digital cameras, music players, HVAC controllers such as thermostats, and/or other manually controlled electronic devices. These electronic devices may be particularly susceptible to Electrostatic Discharge (ESDs) events. In some cases, an ESD event can occur when a user or operator is loaded with static electricity and contacts the electronic device, discharging the static electricity to the electronic device. Such ESD events have been known to cause damage to internal electronic components of the electronic device. Providing some level of ESD protection is thus often desirable.

SUMMARY

This disclosure relates to electronic devices such as HVAC controller devices, and more particularly, to improved use, assembly, construction, and reliability of such electronic devices. This disclosure also relates to devices for protecting electrical components, and more particularly, to methods and devices to help protect electrical components from ESD events. In some instances, an electronic device may include a housing, a printed wiring assembly (PWA), an electronic component, and an electrically conductive connector, where the PWA, the electronic component, and the electrically conductive connector may be situated substantially within the housing. The electrically conductive connector may be mechanically and electrically connected to the PWA. In some cases, the electronic component may be a display, sometimes with a metal backing.

In some instances, the electronic component may be spaced from a surface of the PWA. Illustratively, the electronic component may be spaced from the PWA via a spacer or other feature positioned at least partially between the electronic component and the PWA. In one example, the spacer may have one or more openings through which the electrically conductive connector may pass and then contact the electronic component.

In some instances, the electrically conductive connector may assume an original position and an articulated position. When the electrically conductive connector is in the articulated position, with the electronic component pressing and/or secured against the electrically conductive connector, the electrically conductive connector may exert a spring force against the electronic component and/or against the PWA. In one example, a first portion of the electrically conductive connector may be mechanically and electrically connected to the PWA, and a second portion of the electrically conductive connector may be configured to spring toward and engage a conductive feature of the electronic component.

In some instances, the electrically conductive connector may be used in a method of grounding an electronic component of an electronic device to assist in avoiding electrical damage to the electronic device from an ESD event. In one example, the method may include electrically and mechanically connecting the electrically conductive connector to a PWA, and positioning a spacer between the PWA and the electronic component. In this example, the method may include situating the electronic component adjacent the spacer such that the electrically conductive connector may extend from the PWA and may make electrical contact with a conductive feature on the electronic component. Through implementation of this method, if an ESD event were to occur when a user is interacting with manual controls of the electronic device, the resulting ESD event may be transferred to a grounding feature of the PWA, and away from ESD sensitive components of the electronic device.

The preceding summary is provided to facilitate an understanding of some of the innovative features unique to the present disclosure and is not intended to be a full description. A full appreciation of the disclosure can be gained by taking the entire specification, claims, drawings, and abstract as a whole.

BRIEF DESCRIPTION OF THE DRAWINGS

The disclosure may be more completely understood in consideration of the following description of various embodiments in connection with the accompanying drawings, in which:

FIG. 16A is a schematic cross-sectional view of the illustrative electronic assembly of FIG. 1, taken along line 16A-16A of FIG. 1;

FIG. 16B is a further schematic cross-sectional view of the illustrative electronic assembly of FIG. 1, take along line 16A-16A of FIG. 1, enlarging the portion contained in the dotted circle 16B of FIG. 16A;

FIG. 26A is a schematic cross-sectional view of an illustratively assembled back cover and wall plate;

FIG. 26B is a schematic magnified view of illustrative mating walls between an assembled back cover and wall plate, taken from FIG. 26A;

FIG. 26C is a schematic magnified view of illustrative pockets in the assembled back cover and wall plate, taken from FIG. 26A;

Figure 1:
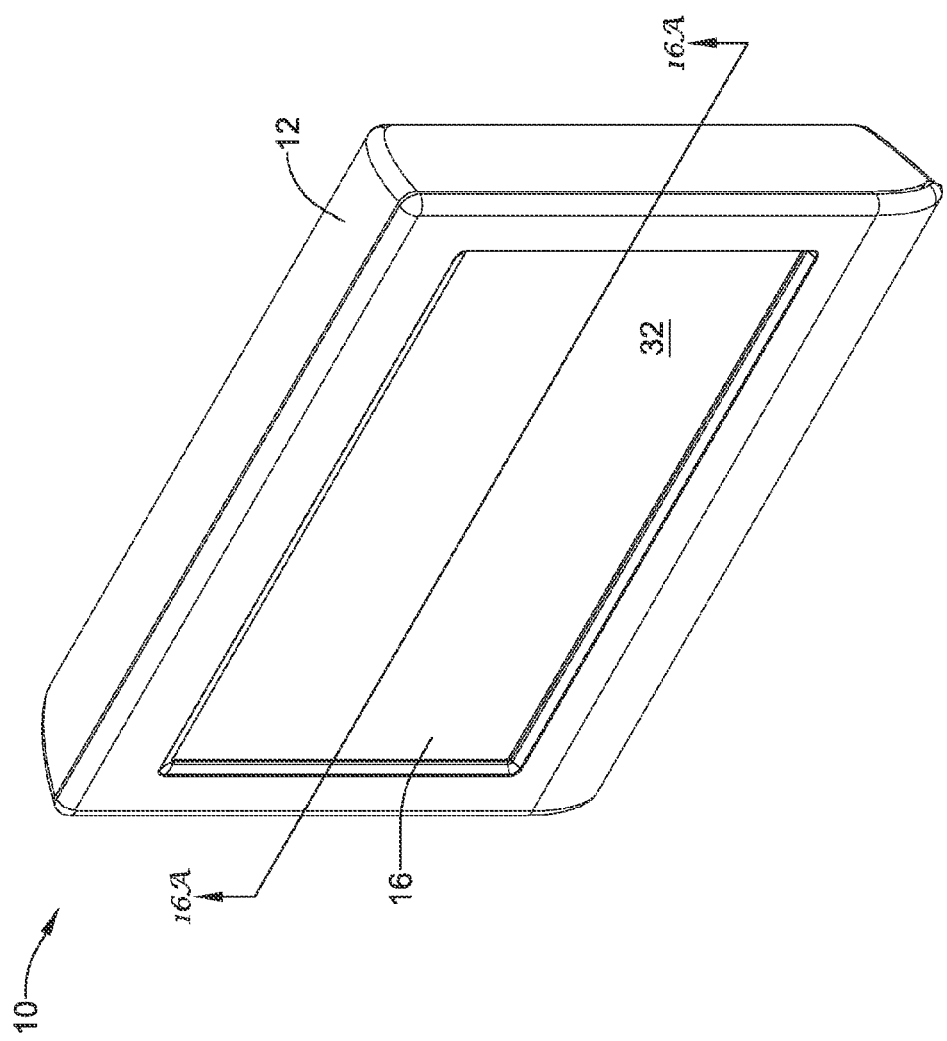
FIG. 1 is a schematic perspective view of an illustrative electronic assembly.

While the disclosure is amenable to various modifications and alternative forms, specifics thereof have been shown by way of example in the drawings and will be described in detail. It should be understood, however, that the intention is not to limit aspects of the disclosure to the particular embodiments described. On the contrary, the intention is to cover all modifications, equivalents, and alternatives falling within the spirit and scope of the disclosure.

DESCRIPTION

The following description should be read with reference to the drawings wherein like reference numerals indicate like elements throughout the several views. The description and drawings show several embodiments which are meant to be illustrative in nature.

For convenience, the present disclosure may be described using relative terms including, for example, left, right, top, bottom, front, back, upper, lower, up, and down, as well as others. It is to be understood that these terms are merely used for illustrative purposes and are not meant to be limiting in any manner.

Figure 2:
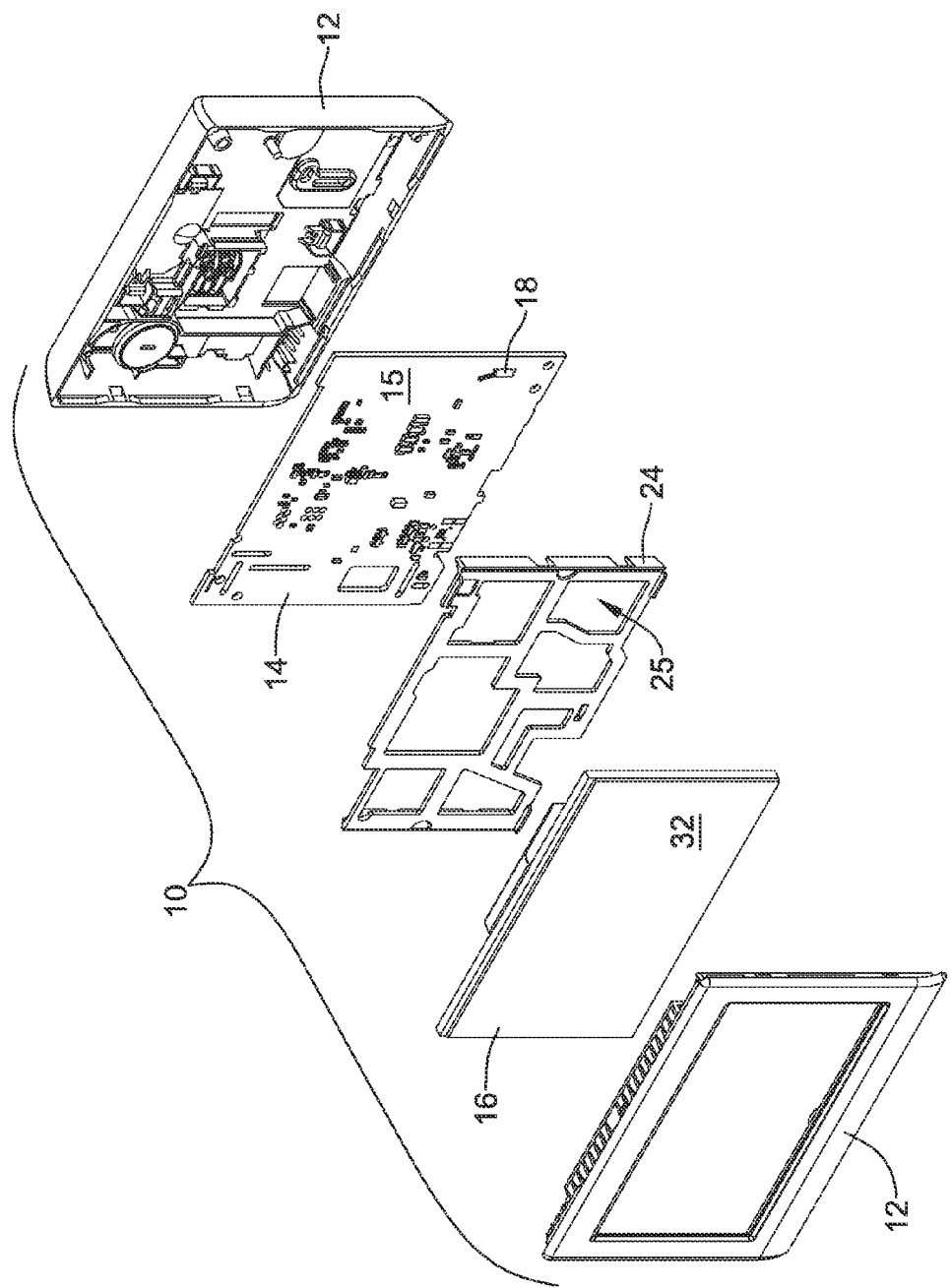
FIG. 2 is a schematic exploded perspective view of the illustrative electronic assembly of FIG. 1.
Figure 3:
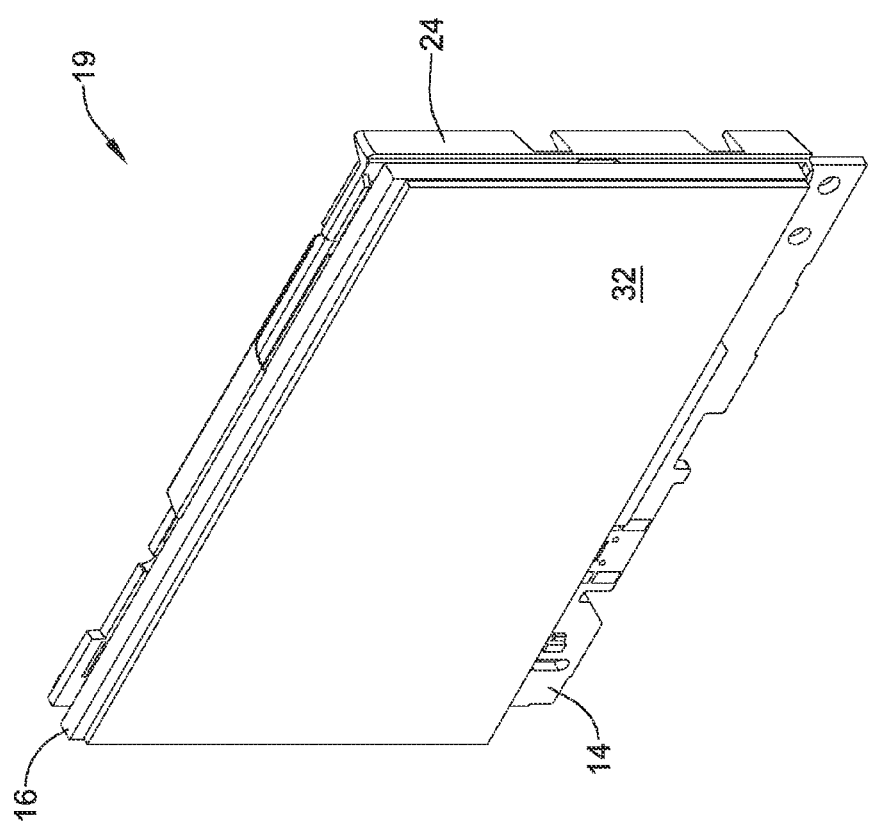
FIG. 3 is a schematic perspective view of an illustrative sub-assembly of an illustrative electronic assembly.

Electronic devices and their electronic assemblies 10, such as the illustrative thermostat shown in FIGS. 1 and 2, may be susceptible to electrostatic discharge (ESD) events. Such ESD events may occur when, for example, the electronic assemblies 10 are contacted by users and static electricity is discharged from the user to the electronic assembly 10. Such ESD events may be harmful to the electronic assemblies 10, as the electronic components of the electronic assemblies 10 may be short circuited or otherwise damaged by the ESD events. Providing some level of ESD protection in configuring an electronic assembly 10 is thus desirable in many situations.

From a hardware perspective, electronic devices and their electronic assemblies 10 may be at least partially protected from ESD events by including a conductive path for passing the electrostatic discharge safely to ground, and bypassing sensitive electronic components of the electronic assemblies 10. In many cases, the electronic assembly 10 may include a printed wiring assembly (PWA) 14, which may include a ground feature, such as a ground plane. When provided, the ground plane may itself help shield sensitive electronic components from an outside ESD event.

In some instances, as shown in FIG. 2, an illustrative electronic assembly 10 may include a housing 12, a PWA 14, an electronic component 16, and an electrically conductive extender or connector 18, where the PWA 14 and the electronic component 16 may be positioned at least partially within the housing 12. In some cases, a conductive shield may be provided adjacent the PWA 14, such as between the PWA 14 and the electronic component 16. In the illustrative example shown in FIGS. 1 and 2, the electronic component 16 may be a touch screen display that itself includes a conductive metal backing which can function as a conductive shield. The conductive shield may be electrically coupled to the ground feature of the PWA 14 via the connector 18, as further described below.

As noted above, the PWA 14 may include a grounding feature, such as a ground plane or other grounding feature (e.g., a grounding point, grounding terminal, ground pad, etc.). In some instances, the grounding feature or grounding plane may be an area of copper foil or other conductive material connected to a grounding point of the PWA 14. The grounding feature or grounding plane may serve as a return path for current from electronic components of the electronic assembly 10. The grounding feature or grounding plane is not specifically identified in the Figures, but may take the form of a conductive layer of the PWA 14, a terminal or pad on the PWA 14, or any other form as desired.

Figure 4:
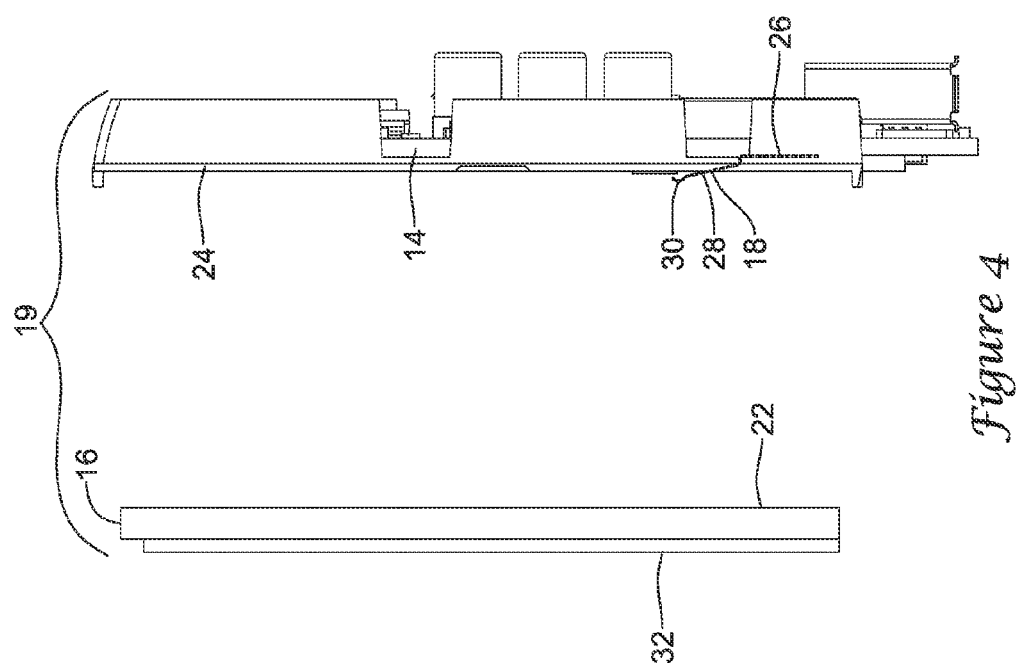
FIG. 4 is a schematic partially exploded side view of the illustrative sub-assembly of the illustrative electronic assembly of FIG. 3.

As indicated above, and in some instances, the electronic component 16 may have a metal backing 22 (e.g., a zinc plating, sheet metal, and/or other metal or conductive material), a portion of a backing that is metal, or a metal feature extending adjacent the back of the electronic component 16. While a metal backing is used in this example, it is contemplated that any suitable conductive layer or shield may be used, if desired. In one example, the electronic component 16 may be a liquid crystal display (LCD) 32 (e.g., an LCD touch screen or other device) that is at least partially enclosed by a metal box structure, where at least a back side (e.g., a side opposite the liquid crystal display 32) includes a metal backing 22 (see FIG. 4). In some cases, the perimeter sides of the LCD display 32, and even a border around the front side of the LCD display 32, may be covered by the metal box structure. Where the electronic component 16 includes metal backing 22 or another conductive feature extending adjacent the back of the electronic component 16, the electrically conductive extender or connector 18 may provide an electrical connection between the metal backing 22 or the other conductive feature and the ground feature of the PWA 14. Such an electrical connection between the PWA 14 and the electronic component 16 may, for example, help ground the metal backing 22 of the electronic component 16 and reduce the chances that an ESD event will cause damage to electronic components mounted on or near the PWA 14.

In some instances, the electronic component 16 and the PWA 14 may be spaced apart from each other when mounted in the housing 12. In one example, the metal backing 22 may be spaced from the PWA 14 and/or from ESD sensitive components on the PWA 14 by a distance greater than about two (2) millimeters, greater than about three (3) millimeters, greater than about five (5) millimeters, greater than about ten (10) millimeters, or any other distance as desired. Such a space may provide sufficient space to accommodate one or more electrical components that may be mounted to the side of the PWA facing a spacer 24 and/or electronic component 16, and in some cases, may help dissipate or distribute heat generated by the PWA 14 and/or electronic component 16 within the housing.

In some instances, to help maintain the space between the electronic component 16 and the PWA 14, the spacer 24 may be provided, as shown in FIGS. 2-4 and 10-12. The spacer 24 may be made from any suitable material(s). For example, the spacer 24 may be made from one or more polymers or other materials having desirable material properties. The spacer 24 may be made from an electrically insulating material, such that the spacer 24 does not create a short circuit between any conductive traces or other components on the PWA 14 and the electronic component 16. Further, the spacer 24 may be configured to help support the electronic component 16 both when users are interacting with the electronic component 16 and when the electronic component 16 may be operating on its own.

Figure 10:
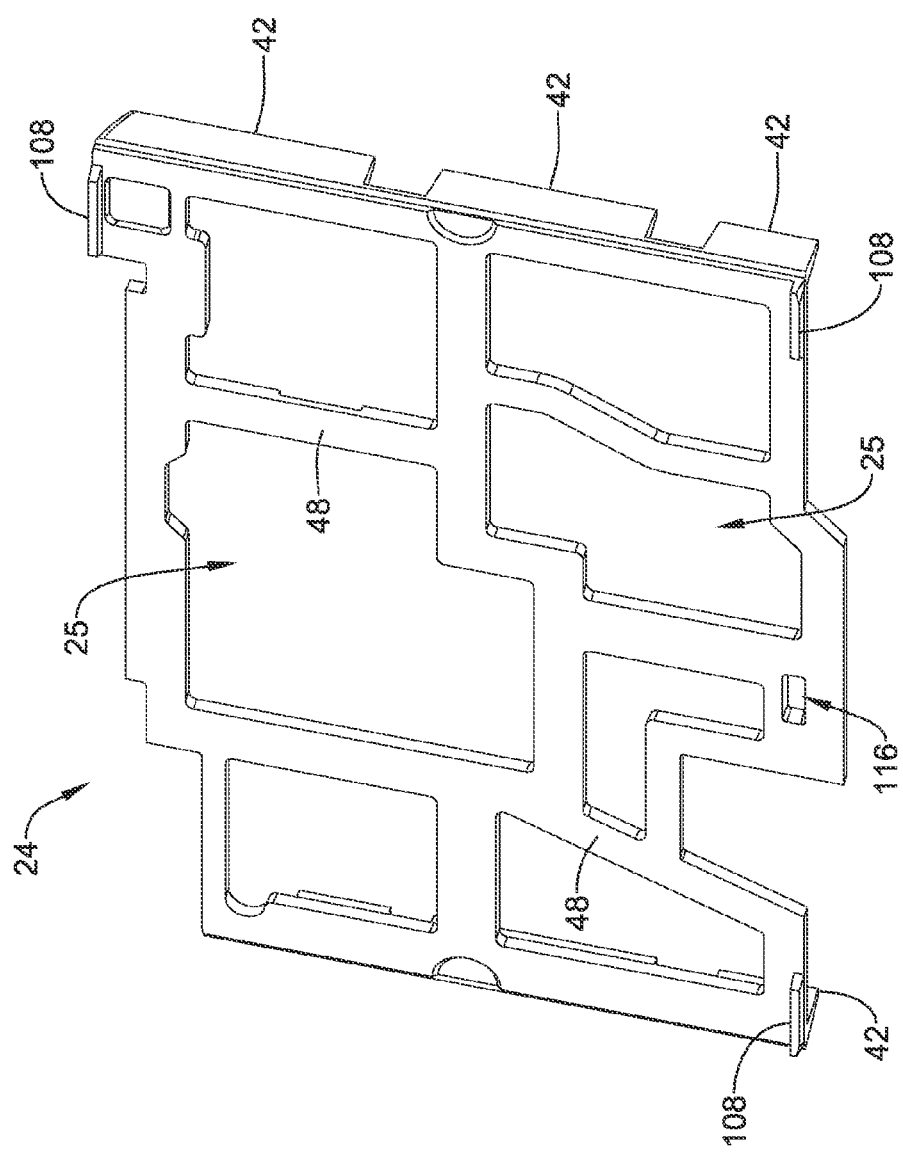
FIG. 10 is a schematic perspective view of an illustrative spacer of an electronic assembly.
Figure 11:
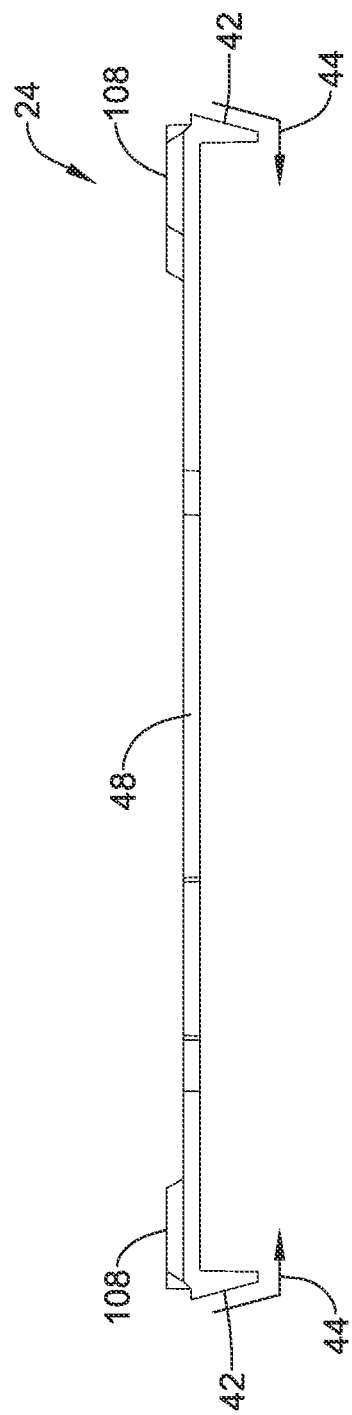
FIG. 11 is a schematic side view of the illustrative spacer of FIG. 10.
Figure 12:
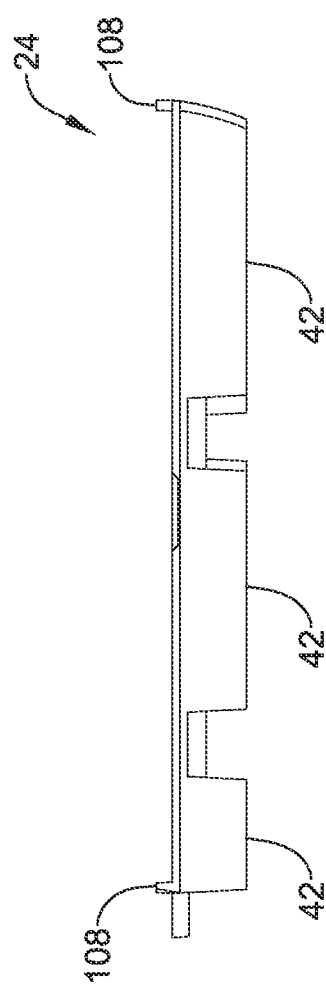
FIG. 12 is a further schematic side view of the illustrative spacer of FIG. 10.

In some instances, the spacer 24 may take on a web-like form, as shown in FIG. 10, and may have openings 46 between structural portions 48. The spacer 24 may have spacer walls 42 extending from and/or forming one or more edges of the spacer 24, as seen in FIGS. 10-12. Illustratively, the spacer walls 42 may extend in the direction of the PWA 14 and/or may extend along an entire edge of the spacer 24 or may extend a partial distance of an edge of the spacer 24, as seen in FIGS. 10 and 12. When in use with the housing 12, the spacer walls 42 of the spacer 24 may be formed to mate with the housing 12, which may help provide an ESD path 44 that travels around ends of the spacer walls 24, as shown in FIG. 11. Because the length of the ESD path 44 is increased by the spacer walls 42, the PWA 14 may be better protected from an ESD event originating from outside of the housing 12.

In some instances, the web-like configuration of the spacer 24 may allow for a double sided PWA 14 component placement, whereas a spacer 24 without openings 46 may not permit component placement on the side of the PWA 14 adjacent the electronic component 16. The openings 46 in the spacer 24 may allow components to be mounted to both sides of the PCB 34 without interfering with the electronic component 16 (e.g., LCD 32) of the electronic assembly 10.

Figure 7:
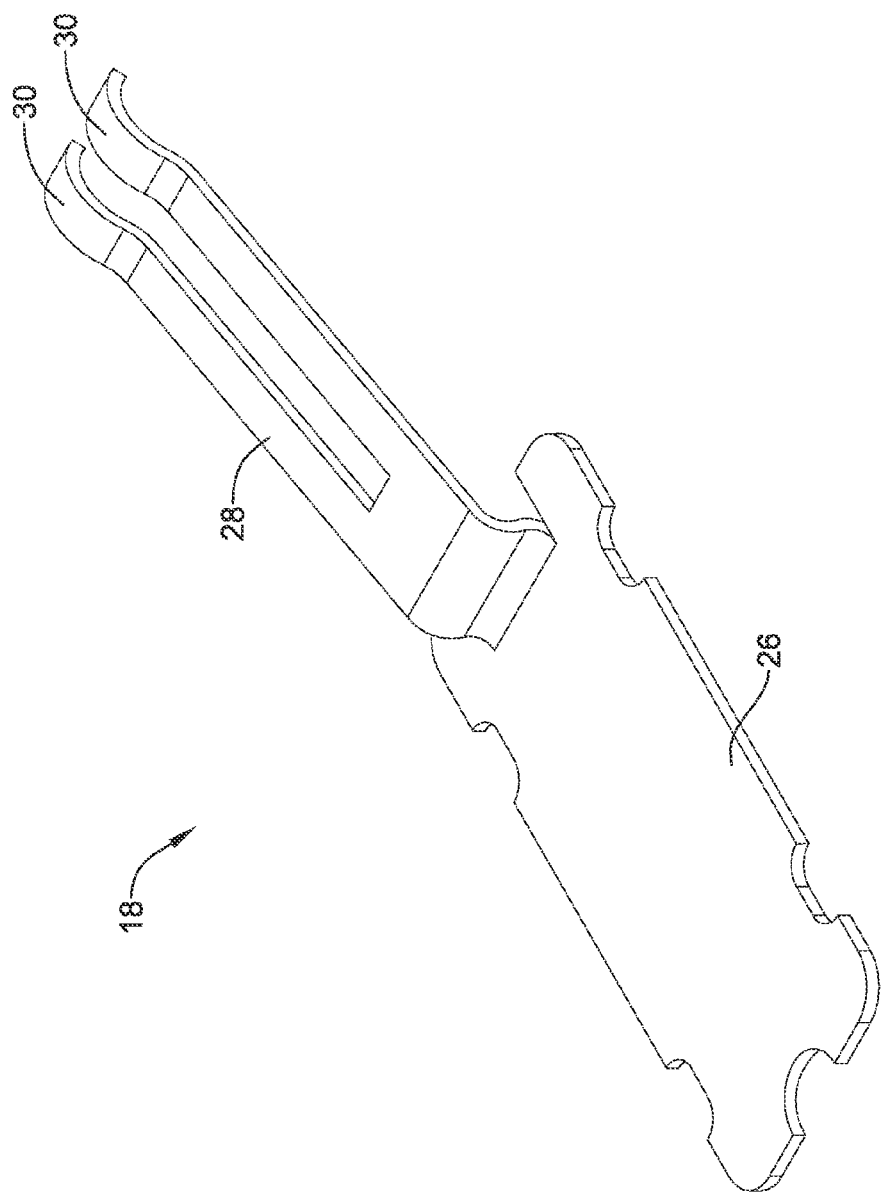
FIG. 7 is a schematic perspective view of an illustrative electrostatic discharge clip of an electronic assembly.
Figure 8:
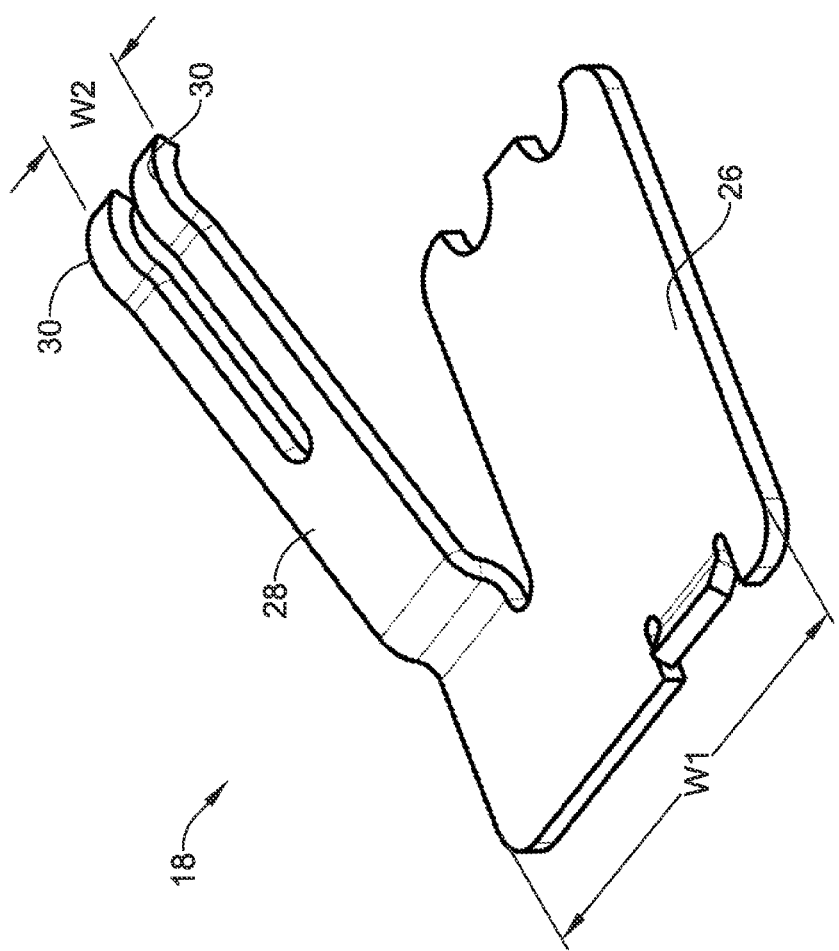
FIG. 8 is a schematic perspective view of another illustrative electrostatic discharge clip of an electronic assembly.

In some instances, the electrically conductive extender or connector 18 may have one or more portions 26, 28, as shown in FIGS. 7 and 8. Illustratively, the electrically conductive extender or connector 18 may have a first portion or connector portion 26, and a second portion or spring portion 28 (e.g., a flexible beam or other feature). In one example, the first portion or connector portion 26 may be integrally formed with the second portion or spring portion 28, as shown in FIGS. 7 and 8. In another example, the first portion or connector portion 26 may be formed separate from the second portion or spring portion 28 and combined in any manner, as desired, to form the electrically conductive extender or connector 18.

Illustratively, the electrically conductive extender or connector 18 may have a form that differs from that of the electrically conductive extender or connector 18 shown in FIG. 7. In one example, the electrically conductive extender or connector 18 may have first portion 26 with a width W1 and second portion 28 with a width W2, where width W2 may have a smaller value than width W1, as shown in FIG. 8. In this example, where width W1 is greater than width W2, the second portion 28 may be located off-center with respect to the first portion 26, as shown in FIG. 8, but this is not required.

Figure 5:
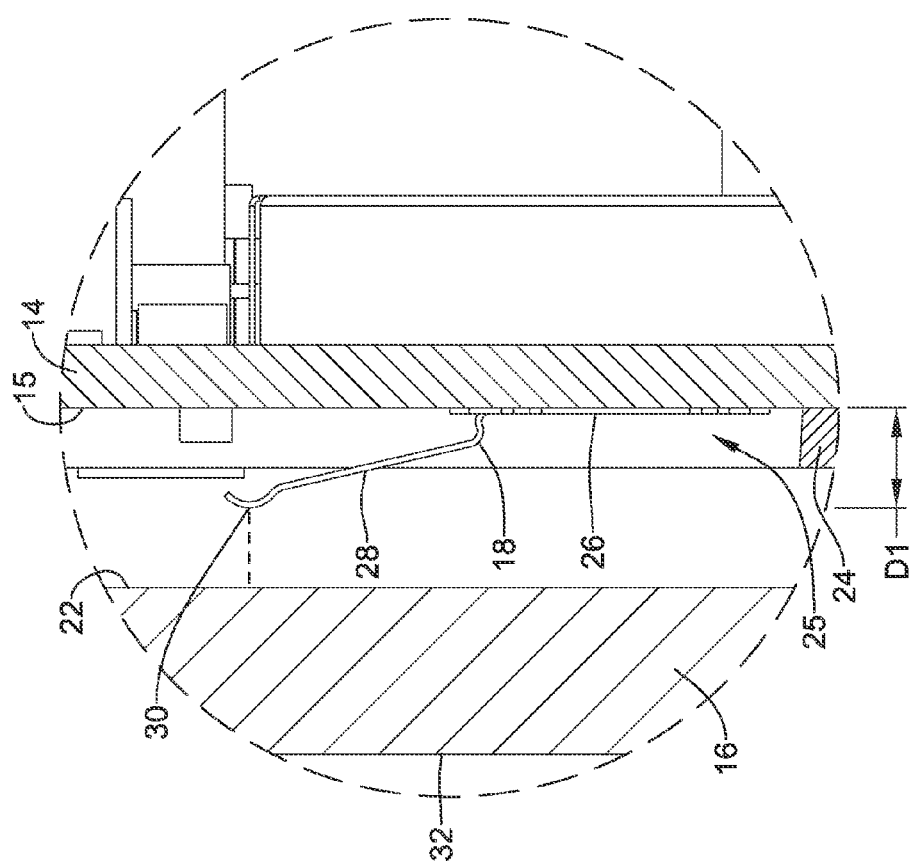
FIG. 5 is a schematic cross-sectional partially-exploded view of the features of the illustrative electronic assembly of FIG. 3 with the electrostatic discharge clip in an original position.

When the first portion or connector portion 26 and the second portion or spring portion 28 are in combination, the electrically conductive extender or connector 18 may have the form of a clip, a spring, a clasp, or other form having a configuration that may be connected to the PWA 14. In some instances, the electrically conductive extender or connector 18 may take on a clip form and may include a first portion or connector potion 26 and second portion or a spring portion 28. The first portion or connector portion 26 may be configured to mechanically connect to the PWA 14, and the second portion or of the spring portion 28 may be configured to mechanically contact and electrically connect to the metal backing 22. In some cases, the first portion or connector portion 26 of the electrically conductive extender or connector 18 may mechanically connect to the PWA 14 via surface mount technology ("SMT"). In other examples, the first portion or connector portion 26 of the electrically conductive extender or connector 18 may mechanically connect to the PWA 14 via mounting techniques that differ from SMT. In some illustrative instances, the first portion 26 of the electrically conductive extender or connector 18 may be soldered to a surface 15 of the PWA 14, such that the second portion or spring portion 28 of the electrically conductive extender or connector 18 may extend away from the surface 15 of the PWA 14 and toward the electronic component 16, as best seen in FIG. 5. In some cases, the first portion 26 of the electrically conductive extender or connector 18 may be soldered to a conductive pad, such as a ground feature or ground plane.

The electrically conductive extender or connector 18 may have a feature that is configured to contact the metal backing 22 of the electronic component 16. In one example, the second portion or spring portion 28 of the electrically conductive extender or connector 18 may have a contact portion 30 for contacting the metal backing 22 of the electronic component 16. The contact portion 30 of the second portion or spring portion 28 may take on any shape and/or size. Illustratively, the contact portion 30 may have the shape of a protrusion or a bump that has a peak rising above any other portion of the electrically conductive extender or connector 18, where, for reference, the electronic component 16 is considered to be above the PWA 14.

Figure 6:
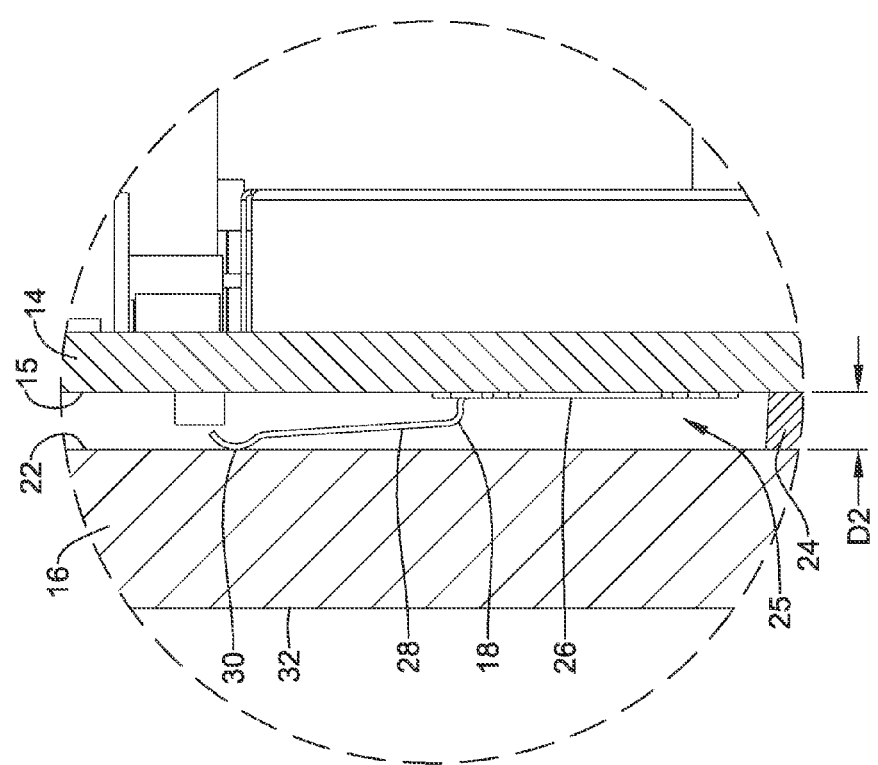
FIG. 6 is a schematic cross-sectional view of the features of the illustrative electronic assembly of FIG. 3 with the electrostatic discharge clip in an articulated position.

In some instances, the electrically conductive extender or connector 18 may be resilient, such that the material and/or form of the electrically conductive extender or connector 18 has mechanically resilient properties. Illustratively, an electrically conductive resilient extender or connector 18 may be configurable between an original configuration or position, as best shown in FIG. 5, and an articulated configuration or position, as best shown in FIG. 6, where the electrically conductive resilient extender or connector 18 may provide a spring force back toward the original configuration. Where the electrically conductive resilient extender or connector 18 is in the articulated configuration (see FIG. 6), the spring force of the conductive resilient extender or connector 18 may be exerted against the metal backing 22 of the electronic component 16, the PWA 14, or the metal backing 22 of the electronic component 16 and the PWA14.

In some instances, when the electrically conductive extender or connector 18 is configurable between an original configuration or position and an articulated configuration or position, the distance between a top portion or the contact portion 30 of the electrically conductive extender or connector 18 and the PWA 14 may vary depending on the configuration. For example, when the electrically conductive extender or connector 18 is in the original configuration, the top portion or the contact portion 30 of the electrically conductive extender or connector 18 may be 1.0-5.0 millimeters, 2.2-2.8 millimeters, 2.4-2.6 millimeters, 2.0-2.5 millimeters, 2.5-3.0 millimeters, or in any other range of distances D1 from the PWA 14, as best shown in FIG. 5. When the electrically conductive extender or connector 18 is in the articulated position, the top portion or the contact portion 30 of the electrically conductive extender or connector 18 may be 0.0-2.0 millimeters, 1.0-2.0 millimeters, 1.2-2.8 millimeters, 1.4-1.6 millimeters, 1.0-1.5 millimeters, 1.5-2.0 millimeters, or in any other range of distances D2 from the PWA 14, as best shown in FIG. 6.

Illustratively, the force between the electrically conductive extender or connector 18 and, for example, the metal backing 22 of the electronic component 16 may be relatively small when in the articulated position. In one example, the force between the electrically conductive extender or connector 18 and the metal backing 22 in the articulated position may be such that the performance of the LCD 32 is not affected by the contact force applied to the metal backing 22 from the electrically conductive extender or connector 18 (e.g., such that LCD 32 is devoid of any color areas or other display of sensitivity to a force acting on the metal backing 22 of the display).

In some instances, large contact forces or resistances between the metal backing 22 and the electrically conductive extender or connector 18 may not be necessary to provide ESD protection. For example, because ESD events typically have relatively high voltage (e.g., approximately 10 kV or other value) and the electric breakdown of the surrounding air is up to 3 kV/mm (e.g., at dry air), an electrostatic discharge may find its way to the electrically conductive extender or connector 18 rather than jump across the space created by the spacer 24 and to an ESD sensitive electrical component mounted on the PWA 14, despite the relatively low contact force between the metal backing 22 and the electrically conductive extender or connector 18.

The electrically conductive extender or connector 18 may be made from any of one or more materials. In some instances, the electrically conductive extender or connector 18 may be made from an electrically conductive material, a resilient material, any other material having desirable properties, and/or any combination of materials having these or other properties. For example, the electrically conductive extender or connector 18 may be made from a phosphor bronze (e.g., a copper alloy), steel, a conductive polymer, or any other suitable material.

Figure 9:
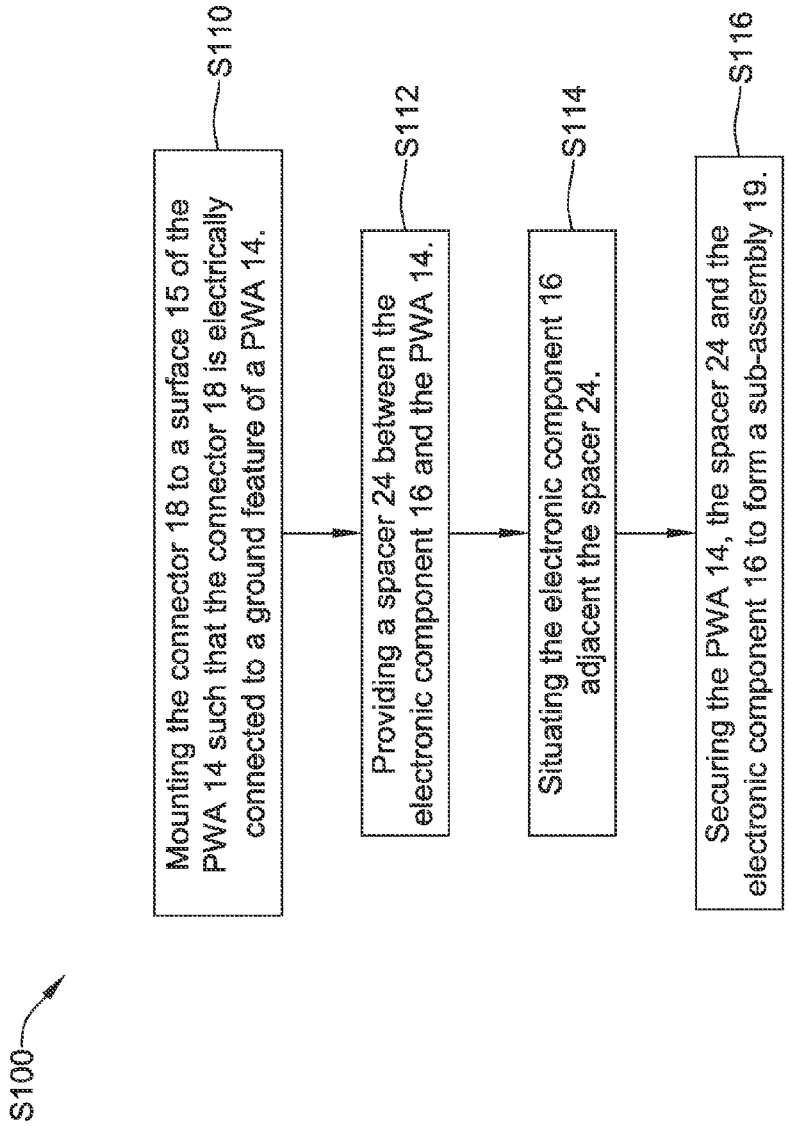
FIG. 9 is a schematic flow diagram of an illustrative method of grounding an electronic component of an electronic device.

In some instances, the electrically conductive extender or connector 18 may be used in a method (S100) of grounding an electronic component 16 of an electronic device or assembly 10, as schematically depicted in FIG. 9 (where the steps listed may be performed in the order depicted or in another order, if at all, as desired). The grounding of the electronic component 16 of the electronic device or assembly 10 may help reduce or prevent electrical damage to one or more electrical components of the electronic device or assembly 10 in response to an ESD event.

Illustratively, the method (S 100) may include electrically connecting an electrically conductive extender or connector 18 (e.g., a resilient electrically conductive extender or connector) to a grounding connection or feature of a PWA 14 of the electronic device or assembly 10. In some instances, the method (S 100) may include mounting the electrically conductive extender or connector 18 to the surface 15 of the PWA 14 (S110). The electrically conductive extender or connector 18 may be mounted to the surface 15 of the PWA 14 with surface mount technology or any other mounting technique. Illustratively, a first portion or connector portion 26 of the electrically conductive extender or connector 18 may be mounted directly or indirectly to the PWA 14. In some cases, the first portion or connector portion 26 of the electrically conductive extender or connector 18 may be mounted to the PWA 14 via an interference type connector such as a screw type connector, a bayonet type of connector, or any other type of interference type connector. In some cases, the first portion or connector portion 26 may be soldered to the surface 15 of the PWA 14. In any event, the electrically conductive extender or connector 18 may be mounted such that the second portion or spring portion 28 thereof may extend away from the surface 15 of the PWA 14 and toward the electronic component 16.

In some instances, the method may include providing a spacer 24 between the electronic component 16 and the PWA 14 (S112) and situating the electronic component 16 adjacent the spacer 24 (S114). In one example of situating the electronic component 16 adjacent the spacer 24 (S114), the electronic component 16 may be situated such that the electrically conductive extender or connector 18 may extend from the PWA 14, through an opening 25 in the spacer 24, and make electrical and mechanical contact with a metal backing 22 or other electrically conductive feature of the electronic component 16. In this example, the electrically conductive extender or connector 18 may be in a bent or other configuration such that it exerts a spring force against the metal backing 22 or other electrically conductive feature of the electronic component 16. In some cases, the spring force of the electrically conductive extender or connector 18 exerted on the metal backing 22 or other electrically conductive feature of the electronic component 16 may be configured and/or set to maintain an electrical connection with the metal backing 22 or other electrically conductive feature of the electronic component 16. The spring force exerted by the electrically conductive extender or connector 18 may maintain an electrical connection with the metal backing 22 or other electrically conductive feature of the electronic component 16 over a range of spacing between a surface 15 of the PWA 14 and the metal backing 22 of the electronic component 16. Illustratively, the range of spacing may be 0.0-3.0 millimeters, 0.0-2.8 millimeters, 0.0-2.6 millimeters, 0.0-2.5 millimeters, 0-2.0 millimeters or any other range of spacing between the PWA 14 and the electronic component 16.

In some instances, the method (S100) may include securing the PWA 14, the spacer 24, and the electronic component 16 together to form a sub-assembly 19 (S116). Securing the PWA 14, the spacer 24, and the electronic component 16 together may be performed using any connecting technique and/or connecting features, as desired. For example, the spacer 24 may clip to the PWA 14 and the electronic component 16, the spacer 24 may be glued to the PWA 14 and the electronic component 16, or the PWA 14, the spacer 24, and the electronic component 16 may be connected in any other manner as desired to form a sub-assembly 19 (see FIG. 4).

Illustratively, the mounting of the electrically conductive extender or connector 18 to the PWA 14 may include performing the mounting before or after the sub-assembly 19 is assembled. When mounted before, the contact portion 30 of the electrically conductive extender or connector 18 may move laterally along the surface 15 of the metal backing 22 as the electronic component 16 is moved toward the PWA 14 and as the electrically conductive extender or connector 18 moves from the original position (see FIG. 5) to the articulated position (see FIG. 6). In some cases, the lateral motion may help the contact portion 30 of the electrically conductive extender or connector 18 make a good electrical contact with the metal backing 22 of the electronic component 16. As best shown in FIGS. 2, and 4-6, in some instances, the electrically conductive extender or connector 18 may be mounted to the PWA 14 such that it extends through an opening 25 in the spacer 24.

In instances where the electronic component 16 is an LCD 32 or other electronic component 16 that may produce heat, the LCD 32 or other electronic component 16 may be an unintended heat generator, which may heat and/or influence thermistors located at the PWA 14. The spacer 24 may be configured to provide an air gap between the LCD 32 and the PWA 14 due to its, optional, web-like configuration. The web-like configuration may limit the heat transfer to the PWA 14 from the LCD 32, while maintaining an overall thin profile of the electronic assembly 10. Further, to prevent direct heat transfer to the thermistors on the PWA 14 through the material of the spacer 24, the material of the spacer 24 may be cut away in, around and/or over the thermistors.

The electronic assembly 10 may have internal, unintended heat sources (e.g., the LCD 32, electronic component on the PWA 14, and/or other unintended heat sources) that may affect the ability of the electronic assembly 10 (e.g., a thermostat as shown in FIGS. 1-39) to accurately sense an ambient temperature. Generally, the internal heat generated by electronic components of the electronic assembly 10 may be related to the input voltage of the electronic assembly 10. In some instances, the input voltage may vary, which may cause the internal temperatures to similarly vary regardless of the actual ambient temperature. Additionally, or alternatively, initial conditions of the electronic device (e.g., before, during, and/or after powering up the electronic device of the electronic assembly) may affect sensing of the ambient temperature. For example, some electronic devices may be powered up after they have been in an OFF state for an amount of time such that the whole device has cooled down/warmed up to the surrounding temperature. On the other hand, if the electronic device is quickly re-powered or re-started, the electronic device may not have cooled down/warmed up from its operating temperature. Further, in some instances, where the electronic device was forced into restarting, the electronic device may not have immediate access to temperature histories and has to start temperature compensation for unintended heat over. All of these considerations may affect the sensing of an ambient temperature and the ability of the electronic assembly 10 to compensate a sensed ambient temperature for unintended heat sources.

Illustratively, to increase ambient temperature estimation accuracy and/or for other purposes, the electronic assembly 10 may use voltage input levels and/or a compensation method upon powering up the electronic device that may differ from a compensation method used after running the electronic device for a period of time. For example, the electronic assembly 10 may be configured to read an input voltage and use the input voltage levels in compensation calculations to provide an offset configured to be used for providing a calculated compensated ambient temperature.

A temperature compensation model may be developed for steady state conditions (e.g., when unintended heat within an electronic device reaches a steady state, that is, when the electronic device has been powered on for a period of time post-start up). Further, it has been found that using the temperature compensation model that was developed for steady state conditions to calculate compensated sensed ambient temperatures at initial start up (e.g., during an initial conditions period), may result in providing sensed temperatures that represent large errors from the actual ambient temperature.

Using two or more temperature compensation models (which may or may not be combined to form a single model) may increase the accuracy of temperature compensation. For example, a first model may be used to accurately resolve or compensate a sensed temperature for initial conditions, where this first model may or may not accurately compensate temperatures during steady states, and a second model may be used to accurately resolve or compensate a sensed temperature for steady state conditions (post powering up), where the second model may or may not accurately compensate temperatures. In some instances, the two or more models may be used concurrently, such that the initial model may fade out (e.g. weighted less) as time and/or voltage input conditions change and the second or further model fades in (e.g. weighted more) as time and/or voltage input conditions change. Such a combination of compensation methods may result in more accurate compensation for sensed temperature calculations under different electronic assembly 10 operating conditions.

Figure 15:
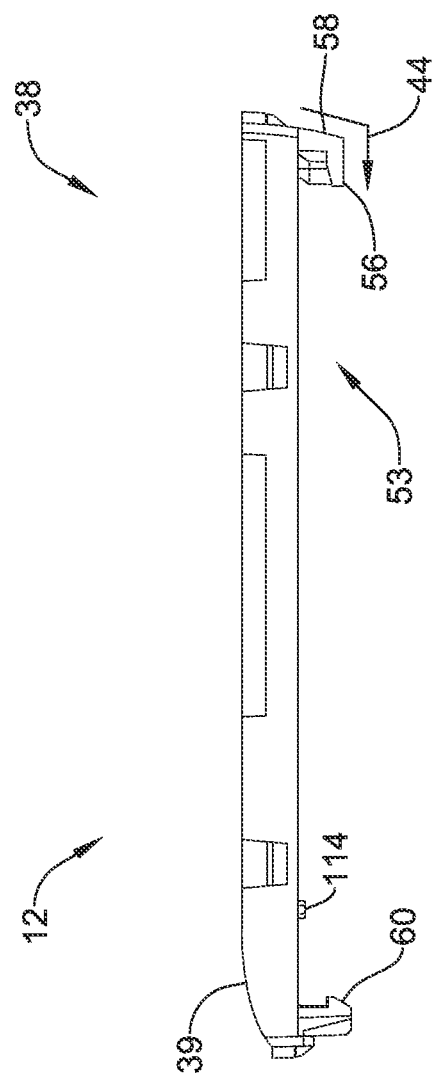
FIG. 15 is a further schematic side view of the illustrative front cover of FIG. 13.

As shown in Figures, the housing 12 may have a front cover 38. In the example shown, the front cover 38 may generally be a frame for receiving the electronic component (e.g., a touch screen component or other component or device) and may have an opening 52 extending therethrough, as shown in FIGS. 13-15, 17, and 21. In some instances, the front cover 38 may include one or more front cover walls 56, where the front cover walls 56 may be configured to mate with surfaces of a back cover 36 of the housing 12 and/or the spacer 24, as shown in FIGS. 16A and 16B. Similar to the spacer walls 42, the front cover walls 56 may define an ESD path 44 for the ESD events, as seen in FIG. 15, which may enter the housing 12 through a gap in the housing 12 at a parting line 40 or at any other location.

Figure 13:
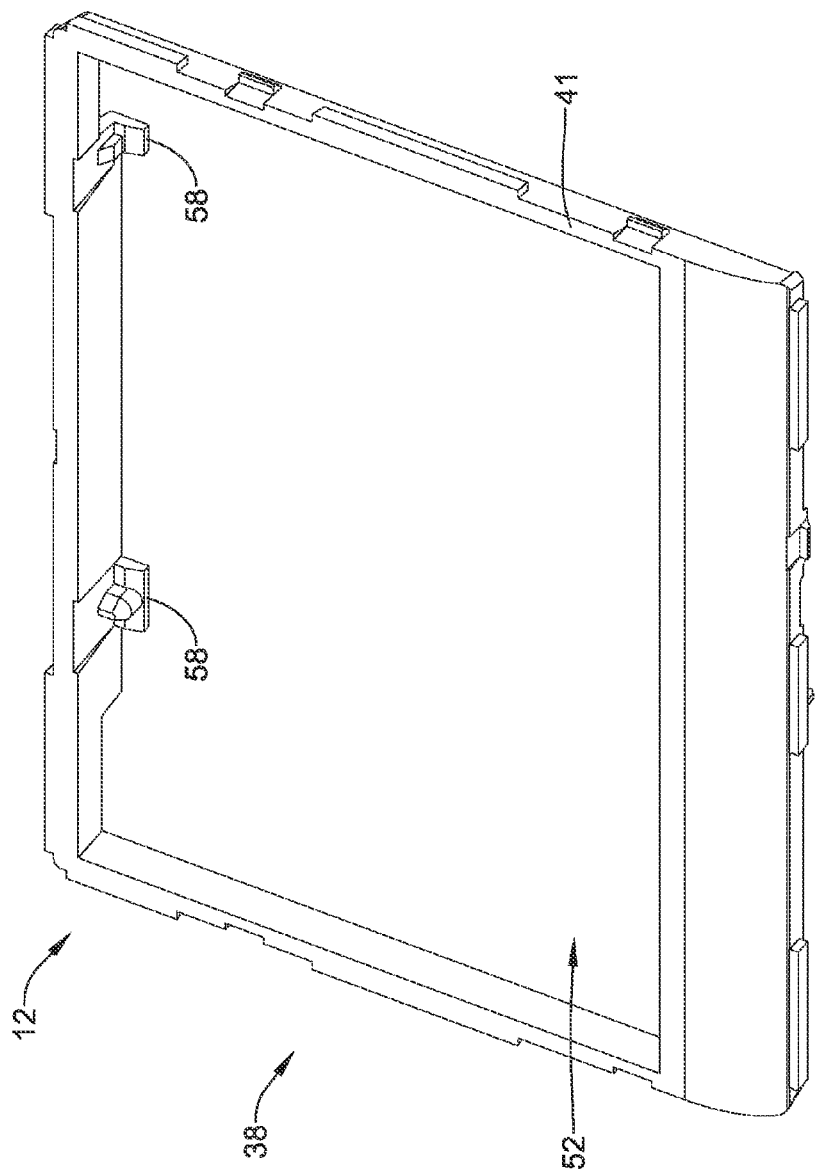
FIG. 13 is a schematic perspective view of an illustrative front cover of an electronic assembly.
Figure 14:
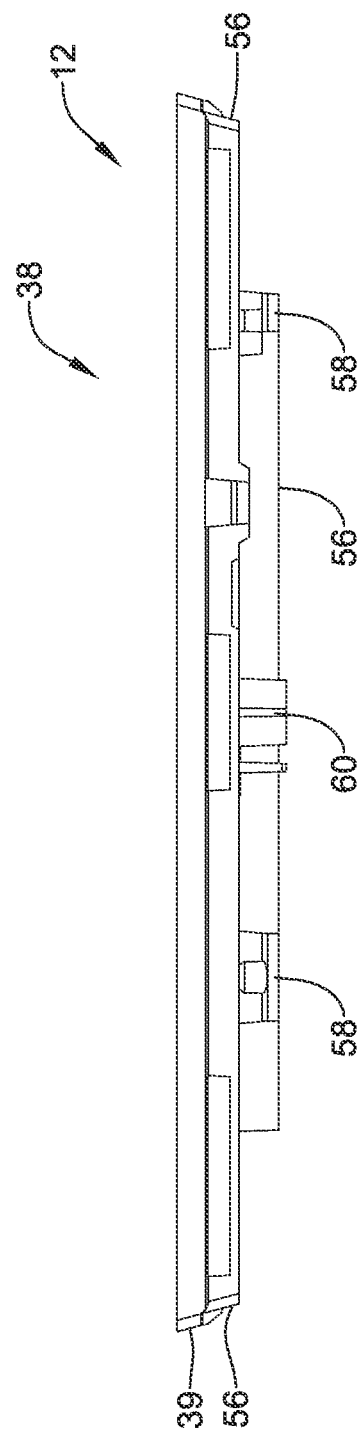
FIG. 14 is a schematic side view of the illustrative front cover of FIG. 13.

It is known that ESDs travel through medium or travel along surfaces by following the shortest possible ESD path 44 with the least resistance, as seen in FIGS. 10 and 13, after it is discharged from a user or other devices. A parting line between portions of a housing for an electronic device may be a suitable inlet through which ESD may travel to the inside of the electronic device. For example, where the front cover 38 and the back cover 36 of the housing 12 meet, a parting line 40 may be formed, as shown in FIGS. 16A and 16B, and it has been found that ESDs may travel to the inside of the electronic assembly 10 through this parting line 40.

During testing of the electronic assembly 10, it was determined that ESDs may carry voltage of up to about 15 kilovolts (kV) or more (although, voltage of an ESD may vary greatly), which is a relatively high voltage. Generally, the electric breakdown strength of dry air in substantially ideal conditions is approximate 3 kV/millimeter (mm). This means that in ideal conditions, a gap having a distance greater than 5 mm is needed to prevent a discharge directly from an electronic component 16 to the PWA 14. In some instances, the ESD may not dissipate as expected due to materials (e.g., mating walls, dirt, humidity) or other factors slowing the dissipation of the ESD and thus, the ESD may travel farther than it is expected to travel in ideal conditions.

As a result of ESDs traveling farther than they would be expected to travel in ideal conditions, it is desirable to extend the ESDs' path of least resistance with the goal of the ESD dissipating prior to it reaching any electronic components of the electronic assembly 10. As shown in FIGS. 16A and 16B, the parting line 40, which may be an avenue through which ESDs make their path to an interior of the of the electronic assembly 10 to the closest electrically sensitive area, may be extended a distance by the placement of the mating walls of the electronic assembly (e.g., the front cover 38, the back cover 36, and the spacer walls 42 of spacer 24.

For example, the spacer 24 may be positioned within the housing 12, such that the spacer 24 contacts the front cover 38 and the back cover 36. Such position of the mating surfaces, may extend the distance the ESD needs to travel to contact an electrically sensitive area within the housing 12 to a distance equal to a length of protective walls 56 of the front cover 38 starting at a gap at an outer surface of the housing 12 between the front cover 38 and the back cover 36 plus a length of the spacer walls 42. In some illustrative instances, the extended distance the ESD may have to travel may be set at least 5 mm, at least 8 mm, at least 10 mm, or other distances of travel greater than 10 mm.

In some instances, the spacer 24 may be situated between the electronic component 16 and the PWA 14, and in some cases, may engage both the facing surfaces of the electronic component 16 and the PWA 14. When the spacer 24 is situated between the electronic component 16 and the PWA 14, the electrically conductive extender or connector 18 may extend through an opening 25 in the spacer 24, as shown in FIGS. 2, 5 and 6. In one example, the electrically conductive extender or connector 18 may extend from the PWA 14, through an opening 25 in the spacer 24, and may mechanically engage and electrically connect to the metal backing 22 of the electronic component 16, as best shown in FIG. 6.

In some instances, the front cover walls 56 of the front cover 38 may be configured to engage and/or align other features of the electronic assembly 10. For example, wall extensions 58 may extend from the front cover walls 56 or other portions of the front cover 38 and interact with the PWA 14 or other feature to align the PWA 14 within housing 12, and in some cases, to at least partially secure the PWA 14 within the front cover 38. Additionally, or alternatively, a clip 60 of the front cover 38 may extend from a base 39 of the front cover 38 and optionally engage and/or align the PWA with the front cover 38. Further, in some instances, the front cover walls 56 may have beveled or chamfered outside edges (e.g., at least beveled or chamfered vertical edges when the electronic assembly 10 is attached to a wall structure), as shown in FIG. 15) that may engage and/or abut mating chamfered or beveled walls of the back cover 36, as shown in FIGS. 16A and 16B.

Generally, the features of the electronic assembly 10 may be configured to give the electronic assembly 10 a slimming look and a thin or minimalist configuration. Additionally, terminal blocks 70 that may receive electrical wiring configured to bring power to the electronic assembly 10 may be positioned on wall plate 80 and recessed into the housing 12 so as to not extend the profile of the electronic assembly 10. Despite being designed to create a thin profile, the electronic assembly 10 may be configured to allow plastic material to surround all electronics of the electronic assembly 10 and prevent substantially all of the electronics from being seen by a user from outside of the electronic assembly 10.

In some instances where the electronic component 16 may be a liquid crystal display (LCD) 32 (the LCD may be a color display or other display), the front cover 38 may be an LCD holder. In such instances, and possibly other instances, the electronic assembly's 10 foot print and/or components may be configured around the size of the LCD display. For example, the LCD display may comprise a display having an approximate diagonal D of 4.3 inches with a height H of approximately 3 inches and a width W of approximate 4 inches, as shown FIG. 19. The display of the electronic component 16 may have other dimensions, as desired.

In some illustrative instances, where the size of the LCD display is approximately 4.3 inches diagonal (approximately 4 inches wide and 3 inches tall), the PCB 34 of the PWA 14 may be slightly taller than three inches. This extra length of the PCB 34 may accommodate an antenna (e.g., a Wifi antenna or other antenna) that is be shielded or blocked by metal backing 22 of the electronic component 16 (e.g. LCD 32). As a result, the base size of the PCB is approximate 4 inches wide and 3.35 inches tall and all of the electronics may be consolidated and/or packaged closer together to fit within this footprint. Additionally, or alternatively, the electronics may be packaged along with the LCD 32, which may allow the device to have a thin profile.

Further, the opening 52 of the front cover 38 may be sized to allow a user to view and/or interact with the display of the electronic component 16, while protecting the electronic component 16. For example, the opening 52 in the front cover 38 may be sized to allow free access to a touch pad of the electronic component 16, sized to cover the visual area viewing angles, sized to protect the PWA against contamination, sized to prevent the cover from interacting with an active touch pad area of the electronic component 16, and/or sized for any other purpose.

Figure 21:
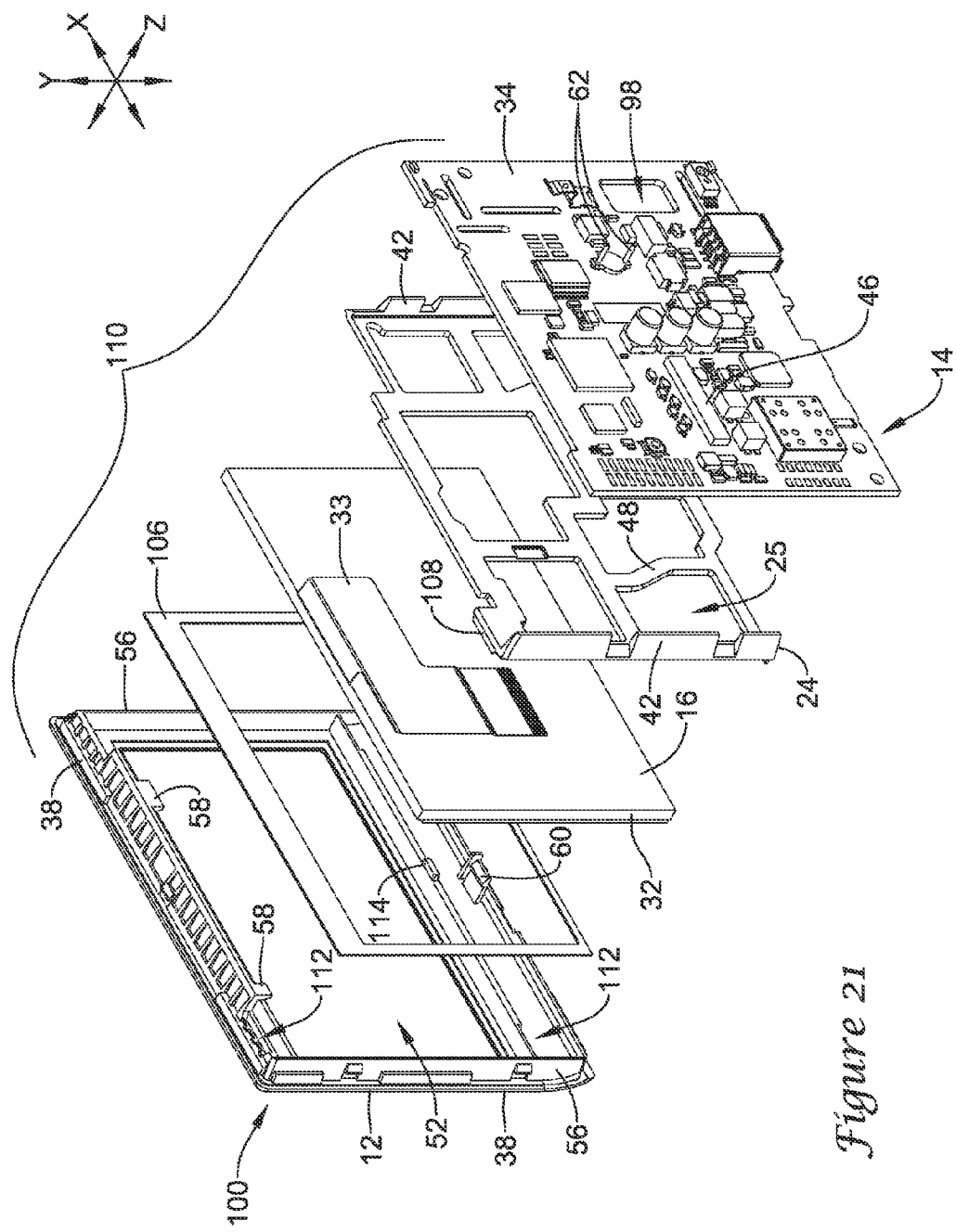
FIG. 21 is a schematic exploded perspective view of an illustrative front cover, gasket and electronic component of the illustrative electronic assembly of FIG. 17.
Figure 22:
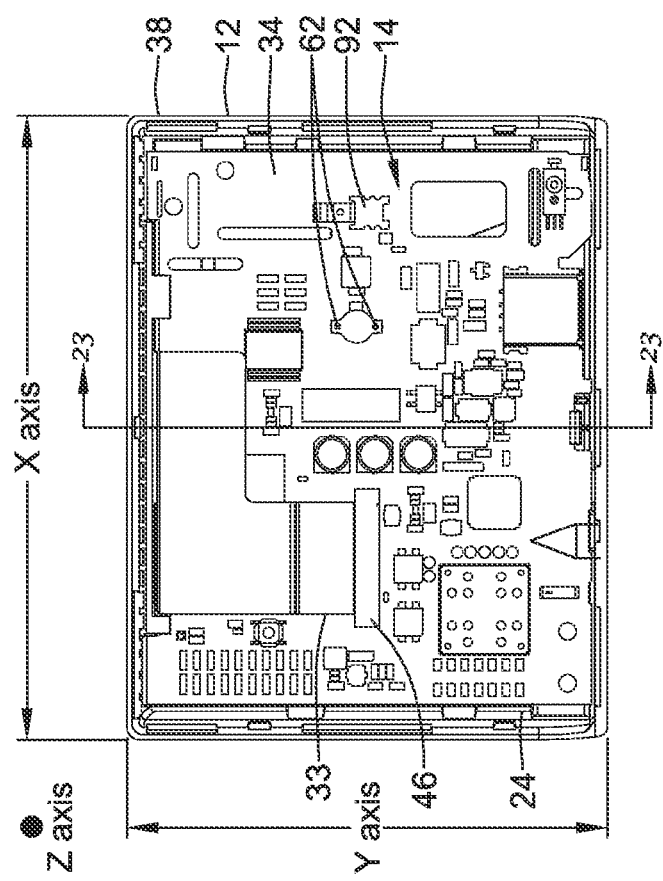
FIG. 22 is a schematic back view of the illustrative electronic assembly of FIG. 17.
Figure 23:
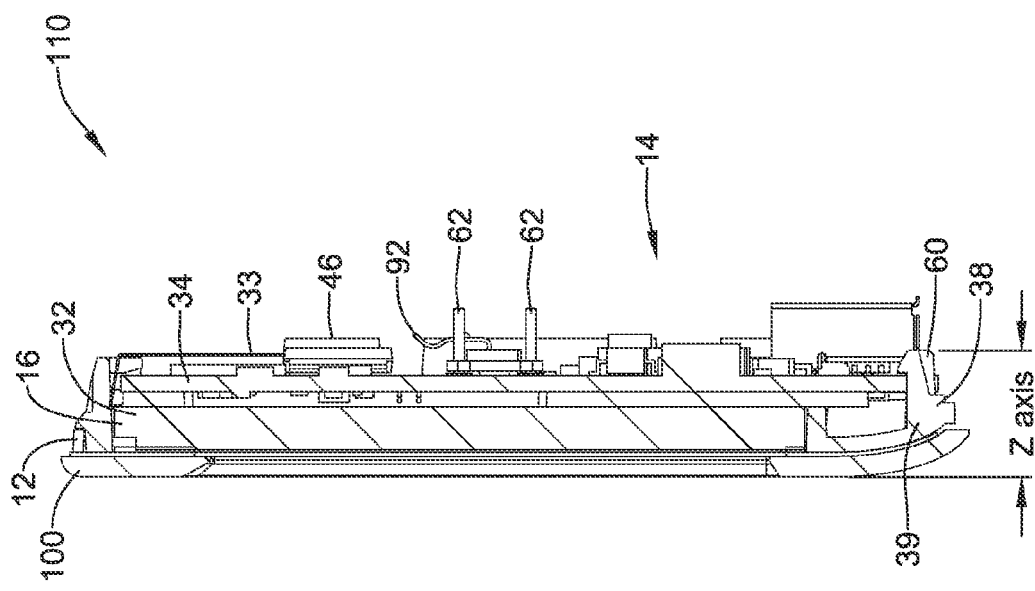
FIG. 23 is a schematic cross-sectional view of the illustrative electronic assembly of FIG. 22, taken along line 23-23.

In some illustrative instances, the front cover 38 may be configured to enclose the electronic component in the X and Y directions, as shown in FIGS. 21-23, in a tight to loose fit. In the Z direction, the fit may be tight to prevent the electronic component 16 from rattling while a user interacts with the electronic assembly 10. Such a tight fit in the Z direction may be facilitated by using the gasket 106, which may fill any extra space resulting from manufacturing tolerances of the front cover wall 56 and the front cover 38.

Figure 17:
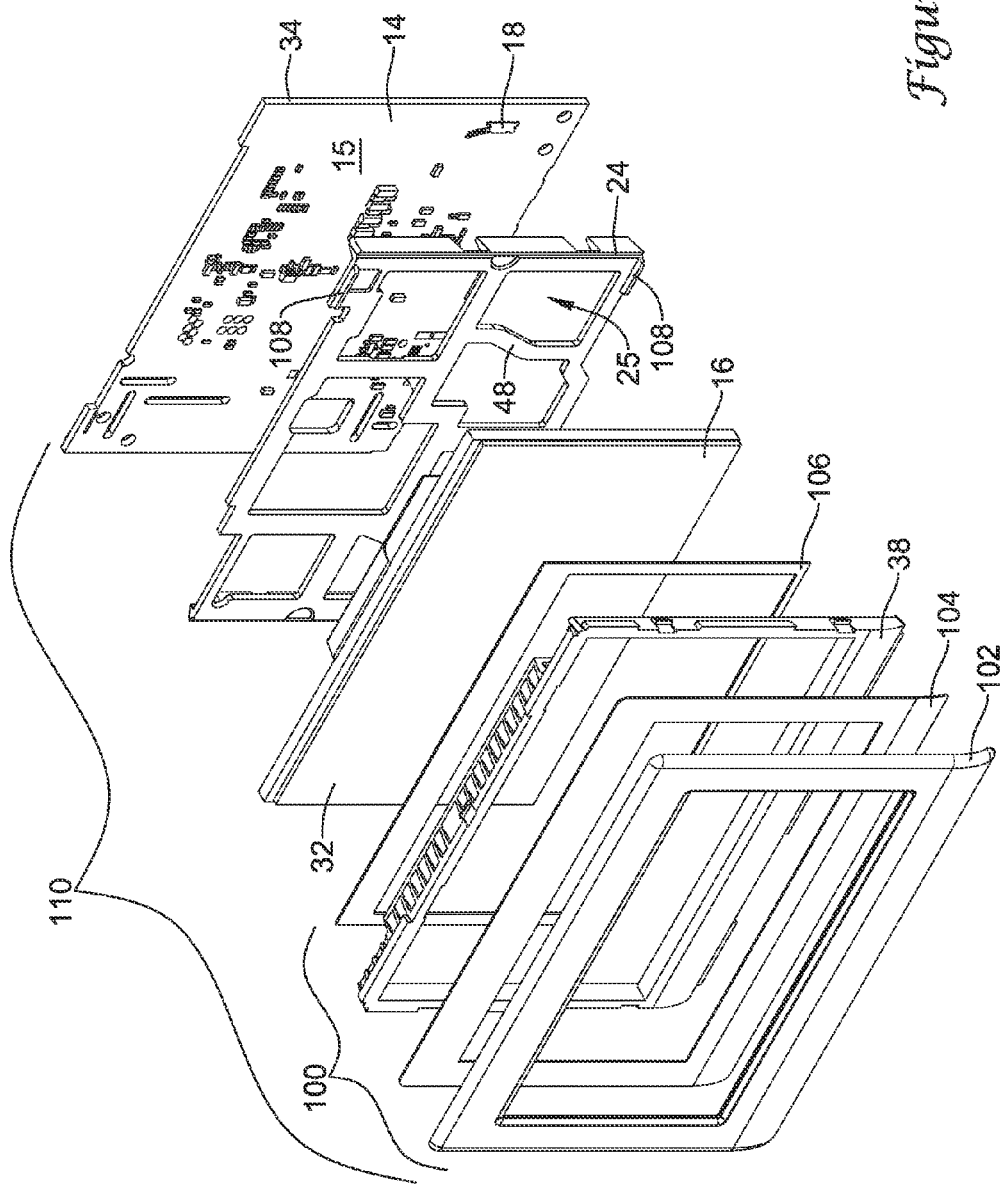
FIG. 17 is a schematic exploded perspective front view of an illustrative front cover, gasket, electronic component, spacer, and printed wiring assembly of an illustrative electronic assembly.
Figure 18:
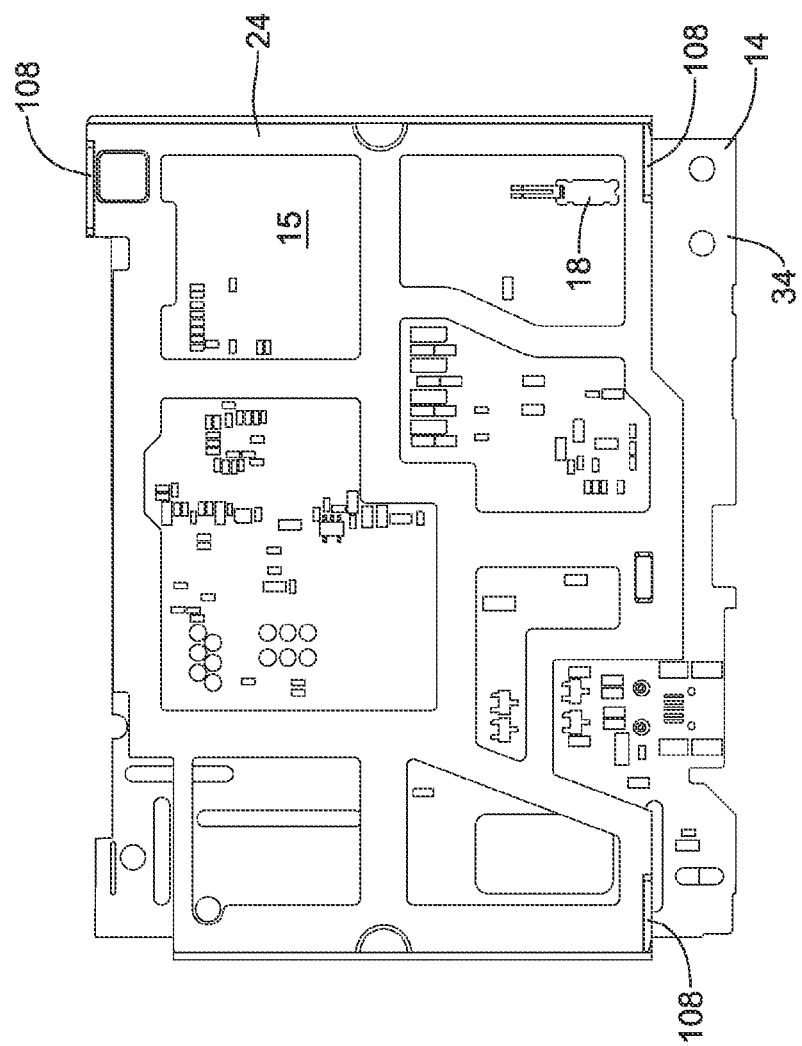
FIG. 18 is a schematic front view of an illustrative spacer engaged with an illustrative printed wiring assembly of an illustrative electronic assembly.

In some instances, the front cover 38 may have a bezel formed at least partially form the base 39 that wraps around the product and which may allow a user to contact the electronic assembly 10 without interacting with the electronic component 16 (e.g., the LCD 32). Further, the front cover 38 may be a front window assembly (FWA) front cover 100 housing, as shown in FIG. 17. The FWA front cover 100 may operate like a rigid LCD panel 32 and PWA 14 holder, such that the FWA front cover 100, the LCD panel 32 and the PWA 14 may be placed in the final electronic assembly 10 as a single sub-assembly 110.

The FWA front cover 100 may be made from a front window 102, adhesive layer 104, front cover 38, and sealing gasket 106, as shown in FIG. 17-20. These parts may be supplied to an assembly line as a single part, separate parts, or a combination of single parts and combined parts, as desired. Then, the LCD 32 may be placed within the front cover 38 of the FWA front cover 100, the LCD 32 may be covered with the spacer 24, and the sub-assembly 110 may be closed by adding the PWA to the spacer 24. In some instances, LCD 32, spacer 24, and PWA 14 may be held in position in the sub-assembly 110 with one or more (e.g., two or more) hinges or wall extensions 58 and one or more latches or clips 60 extending from the base 39 of the front cover 38. Further, the sub-assembly 110 may be configured such that a flex tail 33 of the LCD 32 may be inserted into a connector on the PWA 14, as shown in FIG. 23.

As discussed, the front cover 38 may receive the LCD 32 therein. In some instances, the LCD 32 may rest against the gasket 106 within the front cover 38. The gasket 106 may have several purposes. For example, the gasket 106 may prevent liquid from getting into the electronic assembly 10, the gasket 106 may help create a tighter fit for the components of the electronic assembly 10, the gasket 106 may help prevent ESDs from entering the electronic assembly 10, etc.

Figure 19:
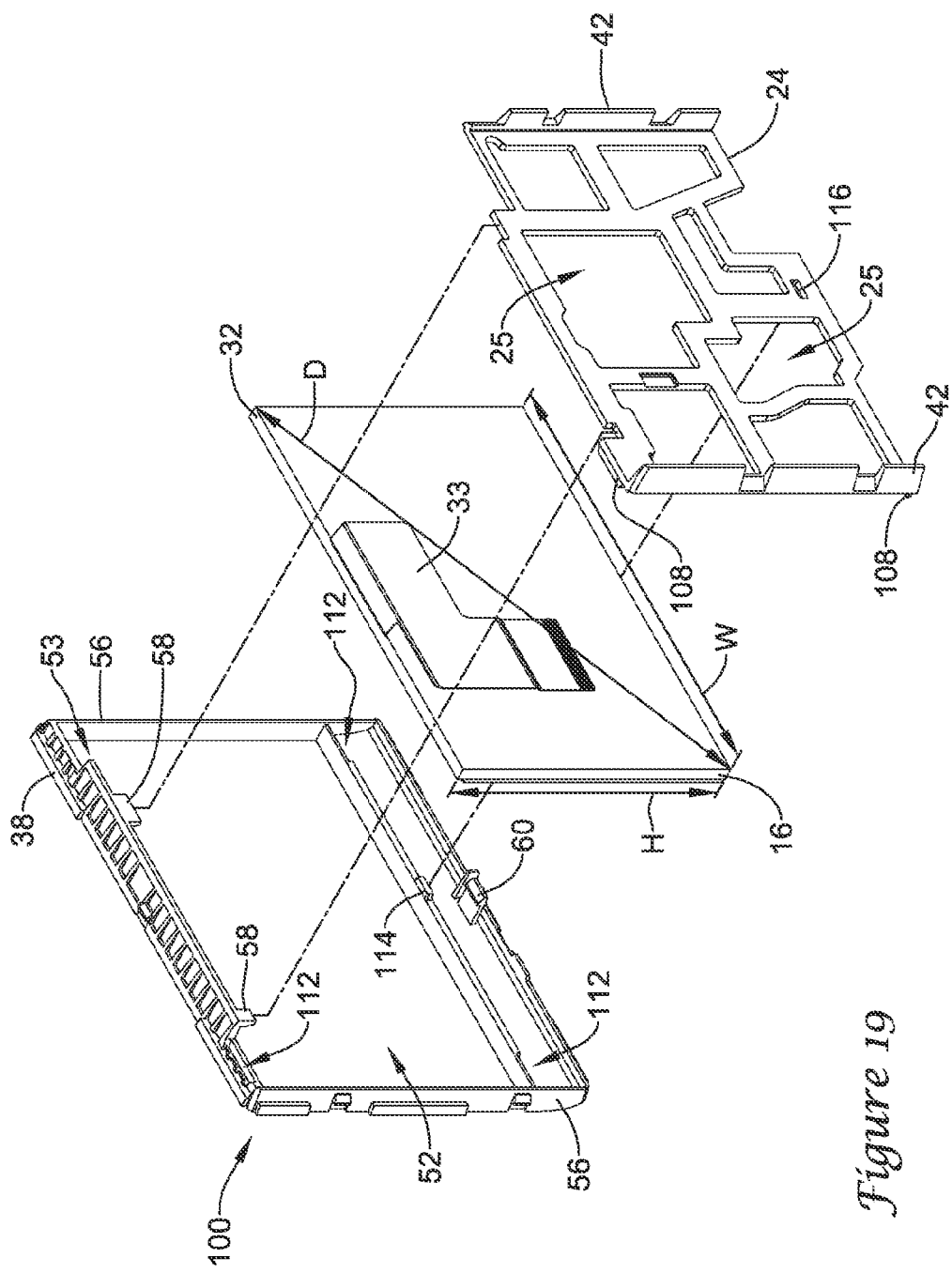
FIG. 19 is a schematic exploded perspective back view of an illustrative front cover, electronic component, and spacer of the illustrative electronic assembly of FIG. 17.
Figure 20:
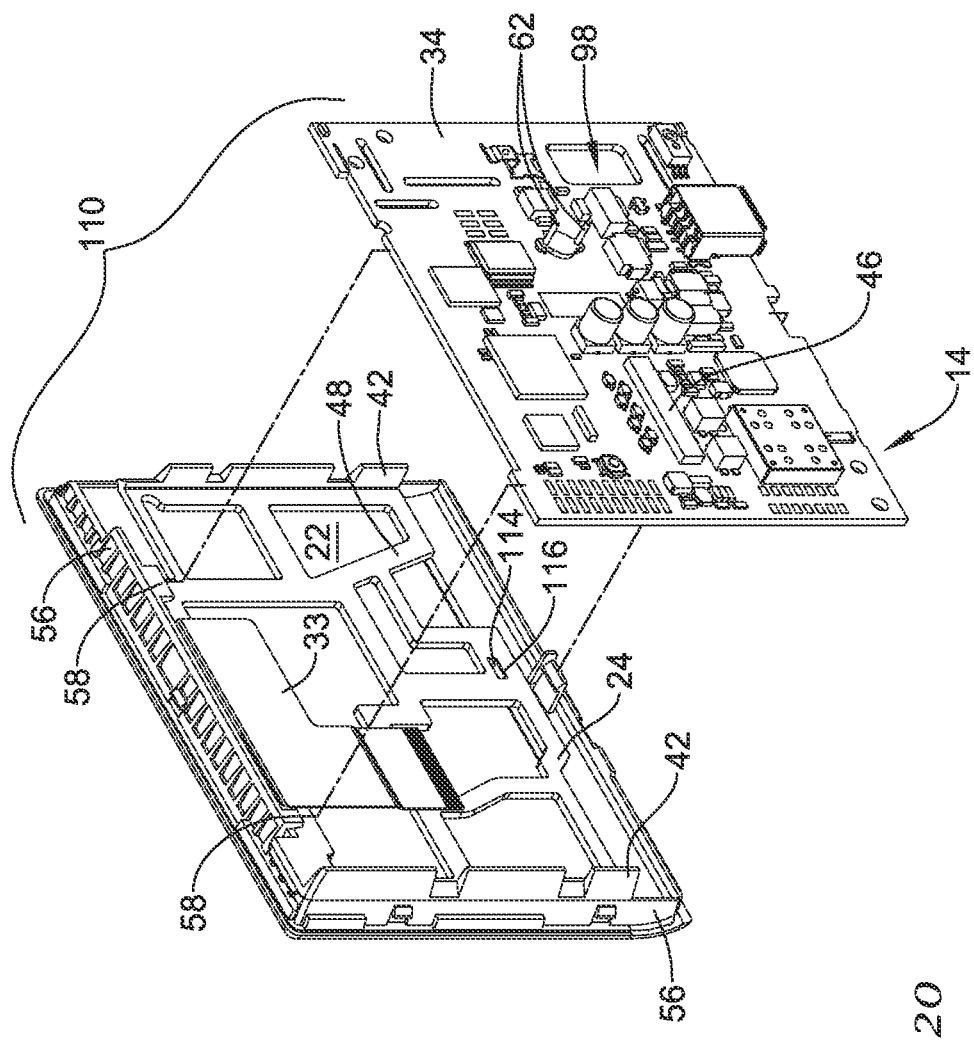
FIG. 20 is a schematic partially exploded view of an illustrative printed wiring assembly exploded from an illustrative front cover, electronic device, and spacer of the illustrative electronic assembly of FIG. 17.

In some instances, the spacer 24 and the front cover 38 may be mating components and may contain several positioning features that do not allow an operator to assemble them in an incorrect orientation. These orientation features include, but are not limited to: ribs 108 in the spacer 24 configured to engage pockets 112 in the front cover 38; grooves in the edges of the spacer 24 and/or the front cover 38; an alignment pin 114 of the front cover 38 configured to engage an alignment pin hole 116 in the spacer 24, as shown in FIG. 19; and/or other positioning features used in any uncombined or combined manner, as desired. In addition to facilitating the proper alignment of the front cover 38 and the spacer 24, the positioning features may help prevent the spacer 24 from moving until the PWA 14 is assembled and the sub-assembly 110 may be fully assembled and locked together.

Figure 29:
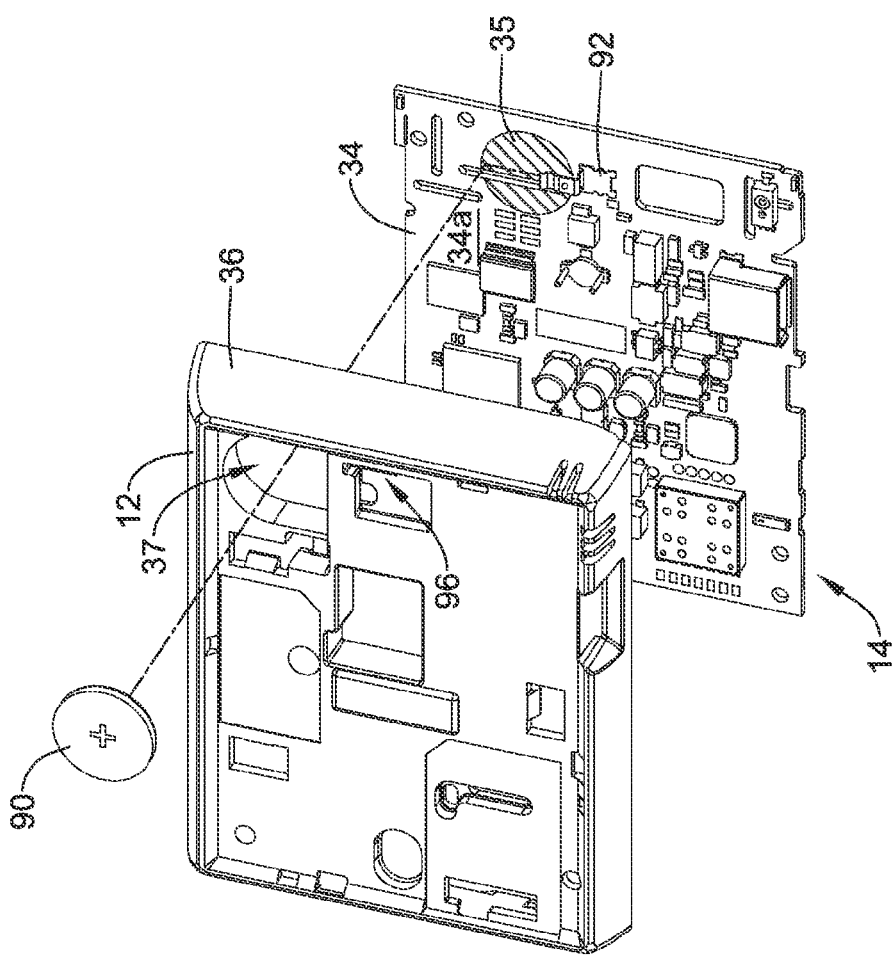
FIG. 29 is a schematic exploded perspective view of an illustrative back cover, printed wiring assembly, and battery of an illustrative electronic assembly.

In some instances, the electronic assembly 10 may be at least partially powered with a battery 90. Illustratively, to structurally facilitate use of the battery 90, the back cover 36 may have a pocket or aperture 37 configured to receive the battery 90, as seen in FIG. 29. Through the aperture 37, the battery may be installed directly on a surface of the PCB 34 or other connection with the PWA 14. Further, once the battery 90 has been placed in the back cover 36, it may be slid down to the connector area 35 having a negative contact. In some cases, the battery may be held in place on the PCB 34 by a battery holder 92 affixed to the PCB 34 and/or the back cover 36. When the battery 90 is correctly installed, the force from the battery holder 92 and gravity may assure that the battery will maintain good electrical contact with the connection on the PCB 34 and will remain in its particular position during handling of the electronic assembly 10. Such design for battery 90 insertion into and removal from the electronic assembly 10 may simplify the assembly process because the battery may be delivered as a separate part and installed at an area where the electronic assembly 10 will be used.

Figure 30:
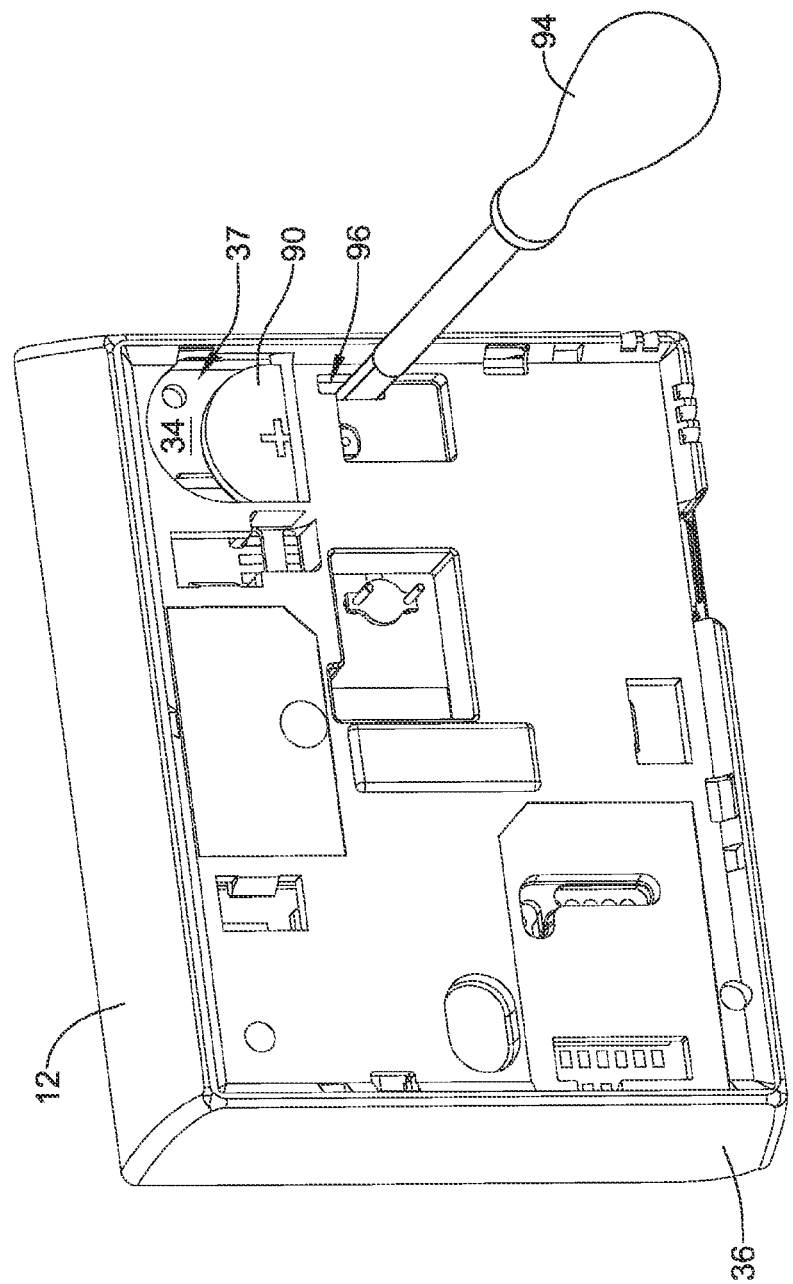
FIG. 30 is a schematic perspective view of an illustrative electronic assembly with a tool inserted therein.
Figure 31:
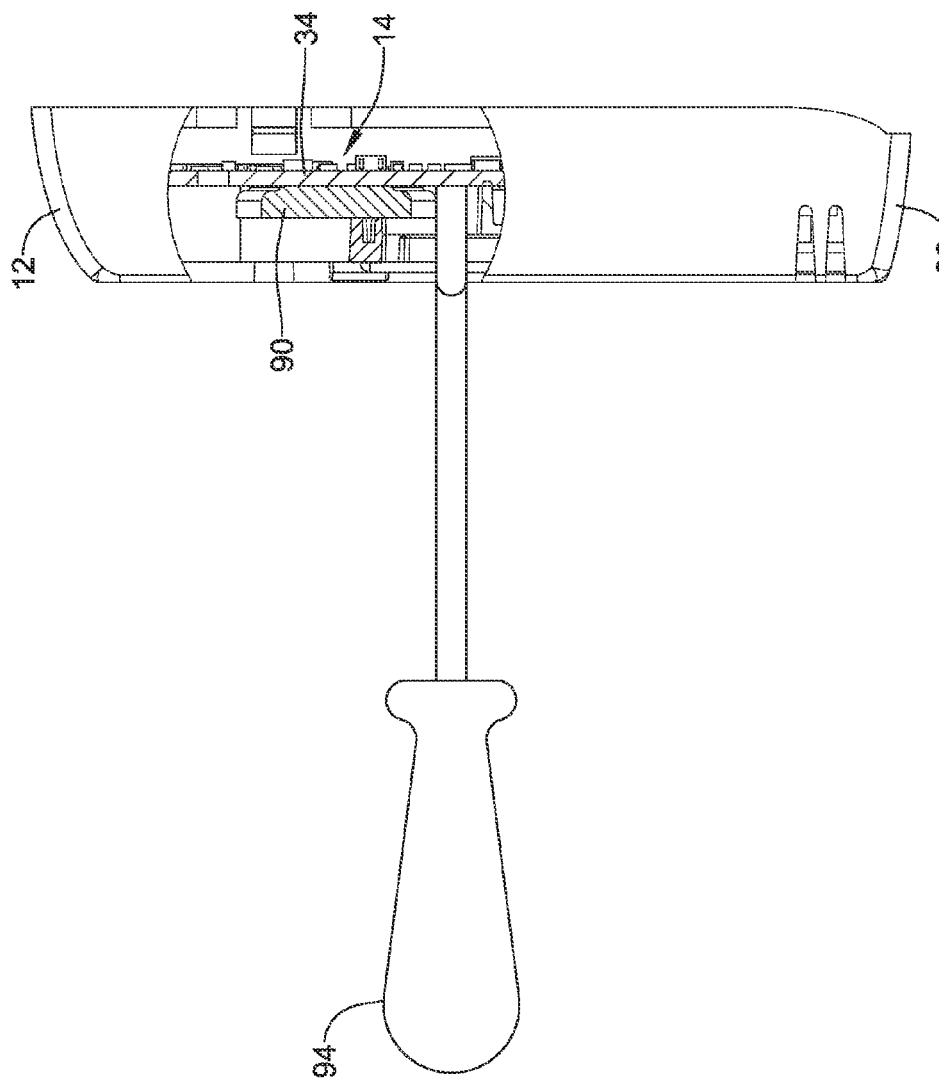
FIG. 31 is a schematic side view of the illustrative electronic assembly with a tool inserted therein, having a portion of the illustrative electronic assembly housing removed.
Figure 32:
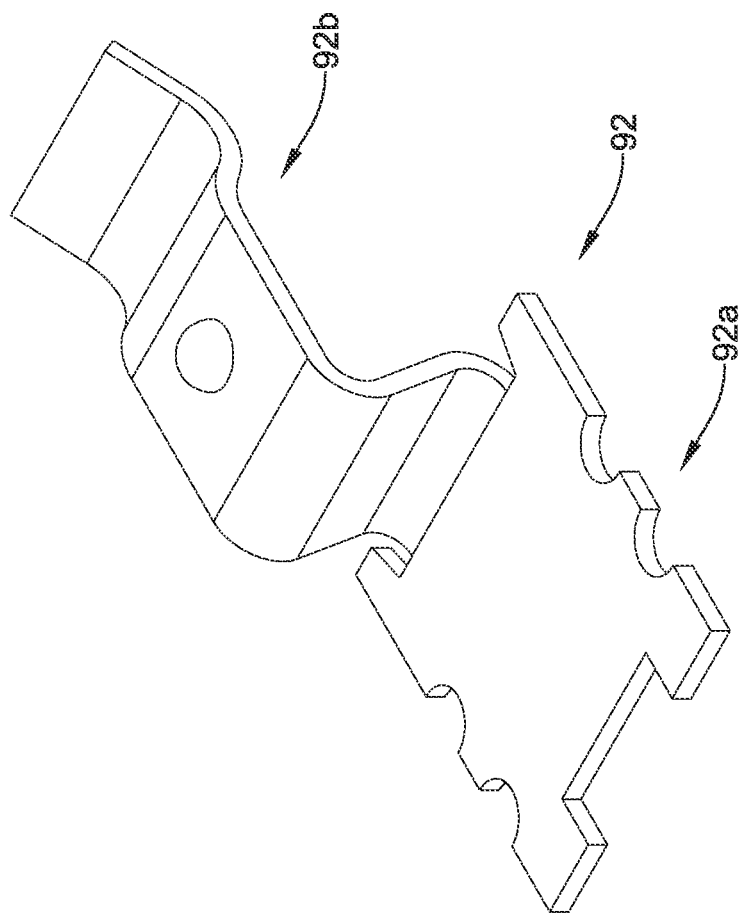
FIG. 32 is a schematic perspective view of an illustrative battery holder.
Figure 33:
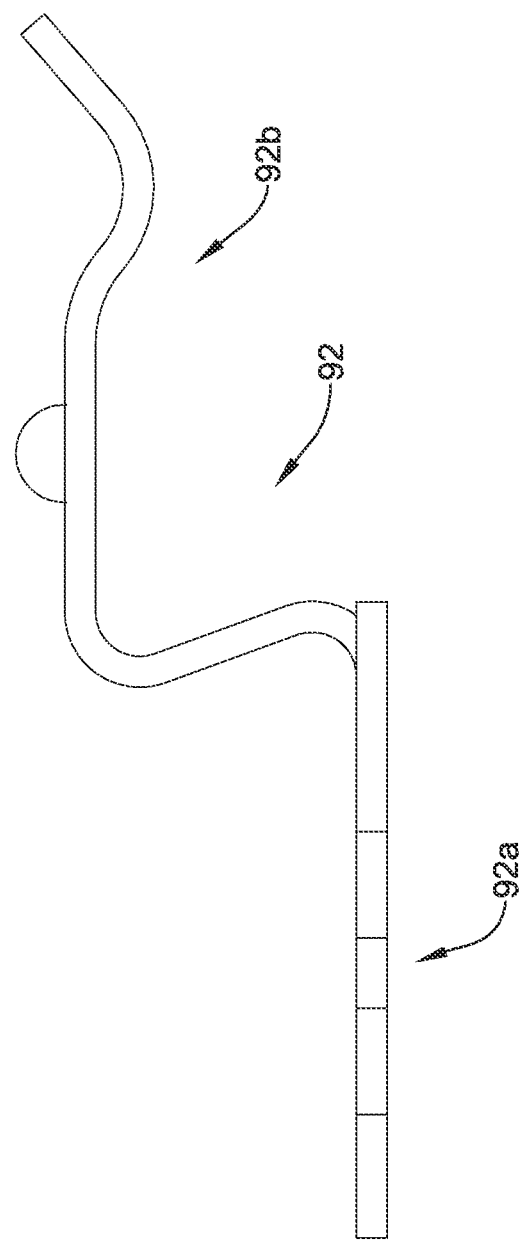
FIG. 33 is a schematic side view of the illustrative battery holder of FIG. 32.

The battery 90 may be removed by a user with the assistance of a screwdriver 94 or other tool, as shown in FIGS. 30 and 31, or in any other manner. For example, a user may insert the screwdriver 94 or other tool into a slot 96 in the back cover 36 of the housing 12 and push the battery 90 from below (e.g., when the electronic assembly 10 is connected to a wall or other structure), which may cause the battery 90 to slide out from the battery holder 92 to be removed by hand. Generally, there is limited risk of the battery 90 shorting when removed with the tool or screwdriver 94 because the slot 96 may not allow the screwdriver 94 or other tool to touch the positive and negative battery contacts. Additionally, or alternatively, the risk of shorting the PWA 14 may be limited by not locating conductive traces and electrical components on the PWA 14 near the slot 96, so that the screwdriver 94 or tool may not contact any conductive traces and/or electrical components.

Figure 24:
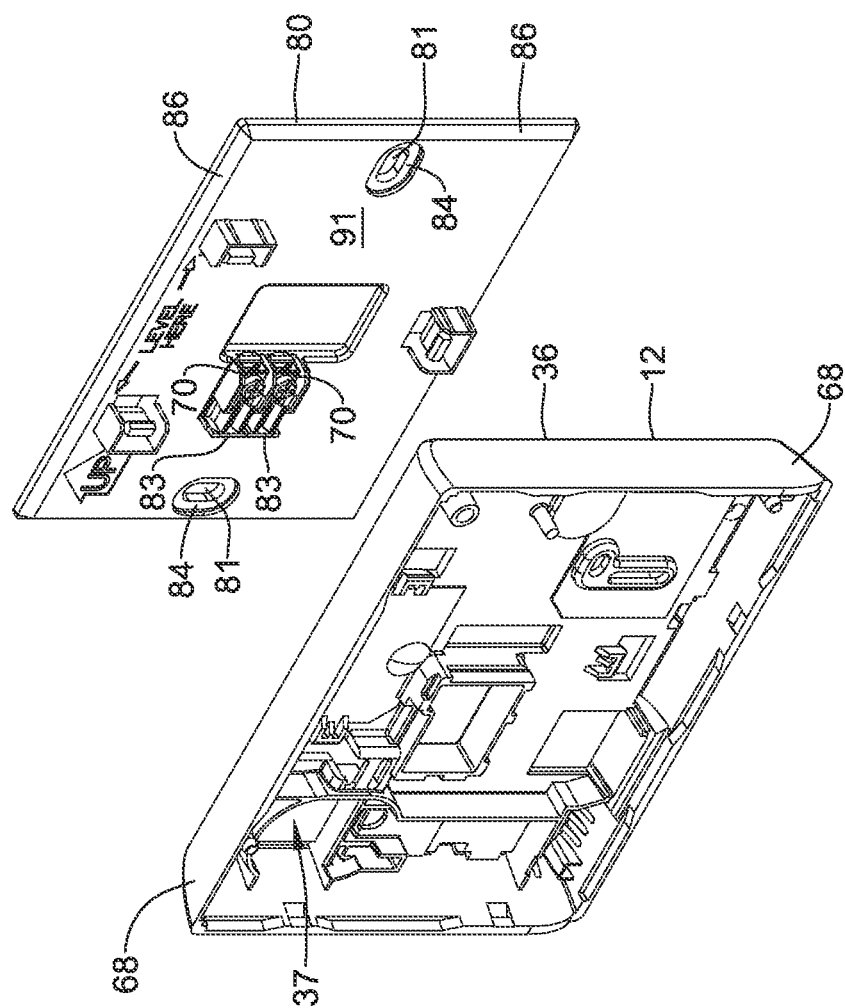
FIG. 24 is a schematic front perspective view of an illustrative back cover and wall plate of an illustrative electronic assembly.
Figure 25:
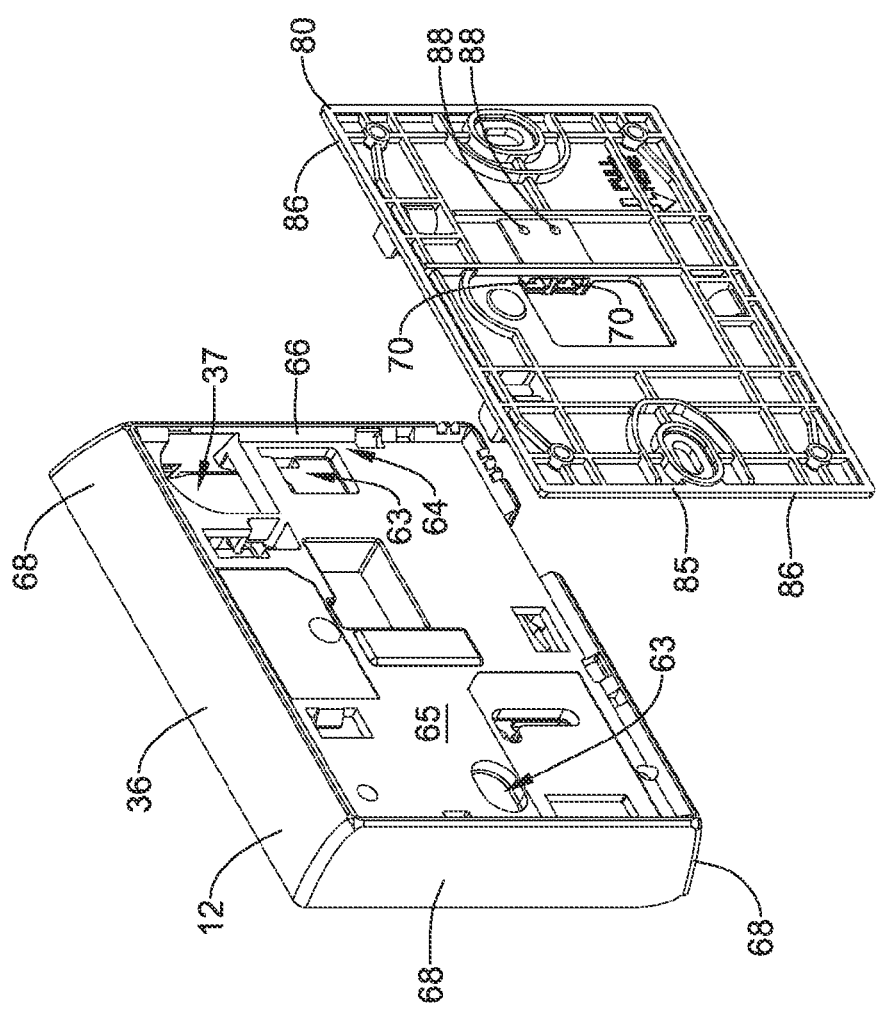
FIG. 25 is a schematic exploded back perspective view of an illustrative back cover and wall plate of an illustrative electronic assembly.

As shown in FIGS. 24 and 25, the battery holder 92 may be Z-shaped. The battery holder 92 may be an electrical terminal for the battery 90 and may be made from electrically conductive material. For example, the battery holder 92 may made from sheet metal and bent or otherwise formed to the desired shape (e.g., Z-shape or other shape) and may be configured to contact a positive (or alternatively, a negative side of the battery 90). The battery holder 92 may be flexible enough to allow for battery 90 insertion and/or removal, while still applying pressure on the battery 90 with a required force to assure proper electrical contact and maintaining the battery 90 at its position with friction forces or other forces. Further, the battery holder 92 may be protected from excessive loads by the surrounding material (e.g., plastic material) of the housing 12.

In some instances, the back cover 36 may be configured to support the PWA 14 and/or the electronic component 16 (e.g., LCD 32). Supporting the PWA 14 and/or the electronic component 16 from a back side may assist in preventing unexpected bending of the PWA 14 and/or the electronic component 16, which may lead to the electronic device malfunctioning.

Figure 27:
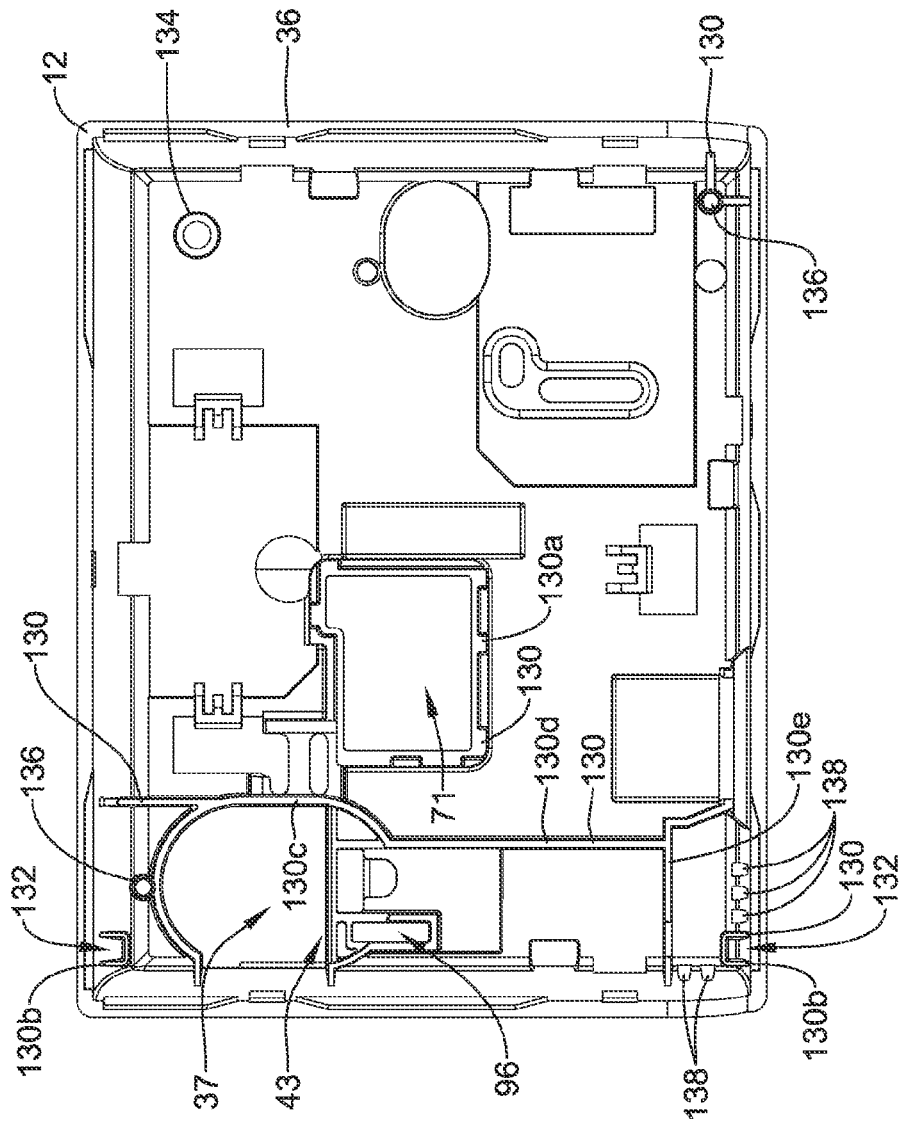
FIG. 27 is a schematic front view of an illustrative back cover of an electronic assembly.
Figure 28:
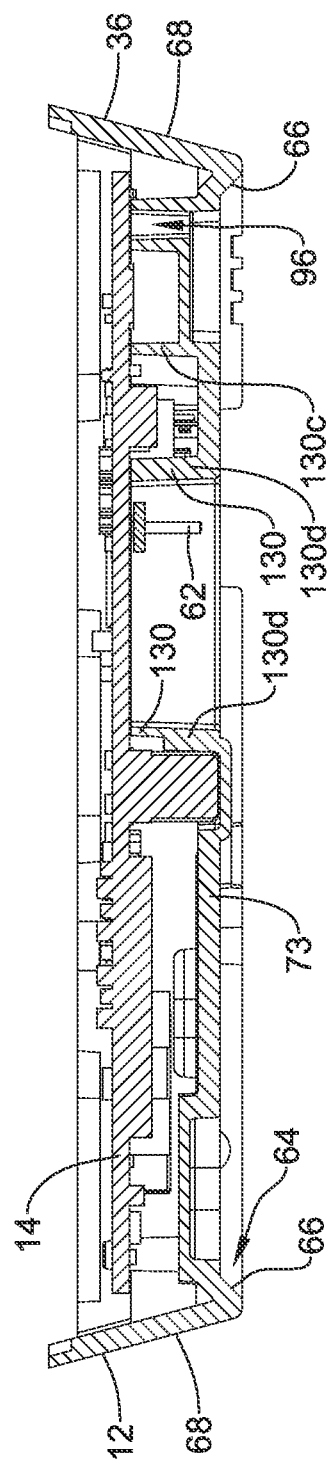
FIG. 28 is a schematic cross-sectional view of an illustrative PWA and a back cover of an illustrative electronic assembly.

As shown in FIGS. 27 and 28, the back cover 36 may include one or more inner walls 130 that extend to the PWA 14 to support the PWA 14 from the back side when it is fully assembled in the electronic assembly 10. The inner walls 130 may have one or more functions. For example, the inner walls 130 may: provide mechanical support for the PWA 14 and/or the electronic component 16; help to prevent ESDs from progressing to shielded areas of the PWA 14; divide an inner volume between the PWA 14 and the back cover 36 into separate spaces and separate colder areas from warmer areas to assist in improving temperature sensing capabilities through separating heat emitting components on the PWA 14 from thermistors on the PWA 14. Alternatively, or in addition, the inner walls 130 may have one or more other functions that may or may not be combined with the listed functions of the inner walls 130.

In some instances, the inner walls 130 of the back cover 36 may have one or more portions. For example, as shown in FIG. 27, the inner walls 130 of the back cover 36 may have: a wall portions 130a configured to surround the pins 62 for connection to terminals 70 in the wall plate 80, which may prevent users from contacting electronic components on the PWA 14 other than the pins 62; wall portions 130b configured to form thermistor pockets 132 and surround thermistors on the PWA 14; wall portions 130c surrounding the battery aperture or opening 37, which may prevent users from contacting other electronic components on the PWA 14 when installing and/or removing batteries 90; wall portions 130d separating cold areas of the PWA 14 from warmer areas of the PWA 14, which may improve the temperature sensing capabilities of the electronic assembly 10; and wall portions 130e surrounding a humidity sensor attached to the PWA 14. Further, in some cases, an interior of the back cover 36 may have one or more alignment feature 136 configured to engage one or more openings in the PWA 14 and align the back cover 36 with respect to the PWA 14, which may be within sub-assembly 110. Additionally, the back cover 36 may include one or more PWA supports 134, which have the dual purpose of providing a testing opening through back cover 36.

With the above illustrative structure of the back cover 36, the wall portions 130 (e.g., wall portions 130a-130e) support PWA 14 by touching a back side of the PWA 14 at some or at least substantially all of the positions atop the wall portions 130. In some instances, the wall portions 130 may facilitate ESD shielding by walling off a central opening for connecting pins 62 to terminal 70 on a wall plate 80. Additionally, or alternatively, the wall portions 130 may improve temperature sensing accuracy by at least partially separating cold areas (e.g., an area surrounding the battery 90) where there are no, or a limited number of, components generating unintended heat. In this cold area of the PWA 14 as defined by the wall portions 130d of the back cover 36, one or more thermistors and/or one or more humidity sensors may be positioned so as to not be affected by heat creating electronic components on the PWA 14. As indicated by the placement of thermistor pockets 132 in the back cover 36, the thermistors on the PWA 14 may be located at top and bottom edges (or at least opposite edges) of the PWA 14. To further protect the thermistors on PWA from unintended heat, the wall portions 130 of the thermistor pockets 132 may substantially entirely surround the thermistors and contact the surface of the PWA 14. Such direct contact between the wall portions 130b and the PWA 14 may assist in decreasing time constants in temperature measuring. Additionally, or alternatively, the wall portions 130d surrounding a humidity sensor at the bottom of the PWA 14 may protect the humidity sensor and have vents 138 to bring humidity changes only to this compartment. As a result of these features and others, the back cover 36 may be configured to support the PWA 14 and/or the electronic component 16, protect features on the PWA 14, and provide an electronic assembly 10 having robust and accurate electronic components.

In some instances, the housing 12, particularly the front cover 38 and the back cover 36, may be formed by any desirable manufacturing process and may be made from any desirable material. For example, the housing 12 may be extruded and made from a plastic material. Alternatively, or in addition, the housing may be made from a different mechanical process and/or a different material.

As shown in FIGS. 24-26C, the back cover 36 may engage the wall plate 80 and, in some cases, substantially enclose the wall plate 80, where the wall plate 80 may be a portion of the electronic assembly that is used to hang the electronic assembly 10 (e.g., a thermostat) on a wall or other structure. In some instances the wall plate 80 may be hung on a wall or other structure with screws 82 or other fastening mechanisms. Where screws 82 are used to fasten the wall plate 80 to a wall or other structure, the wall plate 80 and/or the back cover 36 may include pockets 84 in the wall plate and/or pockets 63 in the back cover 36 to ensure the heads of the screws 82 do not act as a limiting factor in the thinness or thickness of the electronic assembly 10.

In some instances, the back cover 36 may have a raised perimeter 64 that may at least partially define a volume configured to accept and/or receive at least a portion of the wall plate 80. This raised perimeter 64 may have chamfered or beveled walls 66 that may correspond with chamfered or beveled walls 86 of the wall plate 80. In some cases, the respective chamfered or beveled walls 66, 86 may be used to self align the back cover 36 with the wall plate 80. The chamfered and/or beveled walls 66, 86 may be angled at any angle. For example, the chamfered and/or beveled walls 66, 86 may be angled at a 45 degree angle or a different angle, as desired.

In some instances, the back cover 36 may be further configured to have a limited profile. For example, the side walls 68 of the back cover 36 may extend inward, such that the front of the back cover 36 that is adjacent the front cover 38 defines a larger circumference than a circumference defined by a back of the back cover 36 that is adjacent the wall plate 80.

Figure 34A:
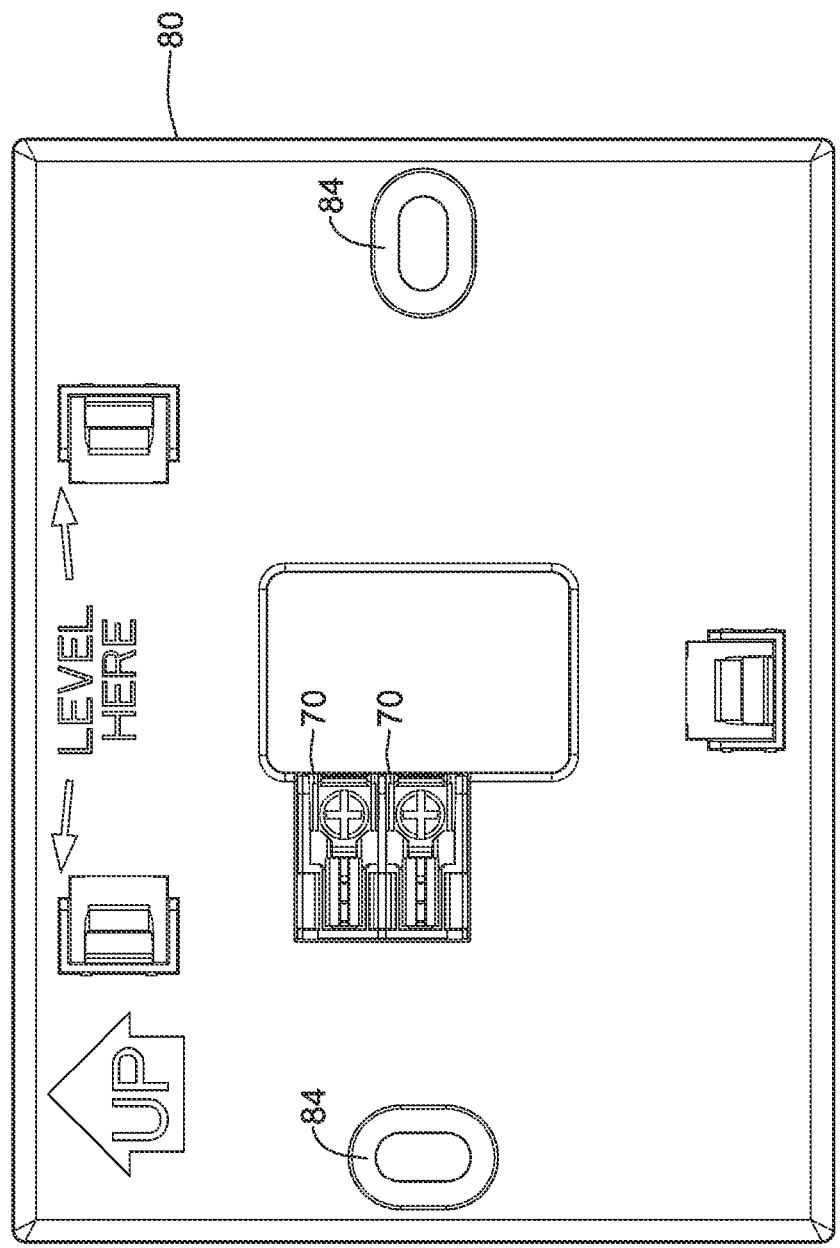
FIG. 34A is a schematic front view of an illustrative wall plate of an illustrative electronic assembly.
Figure 34B:
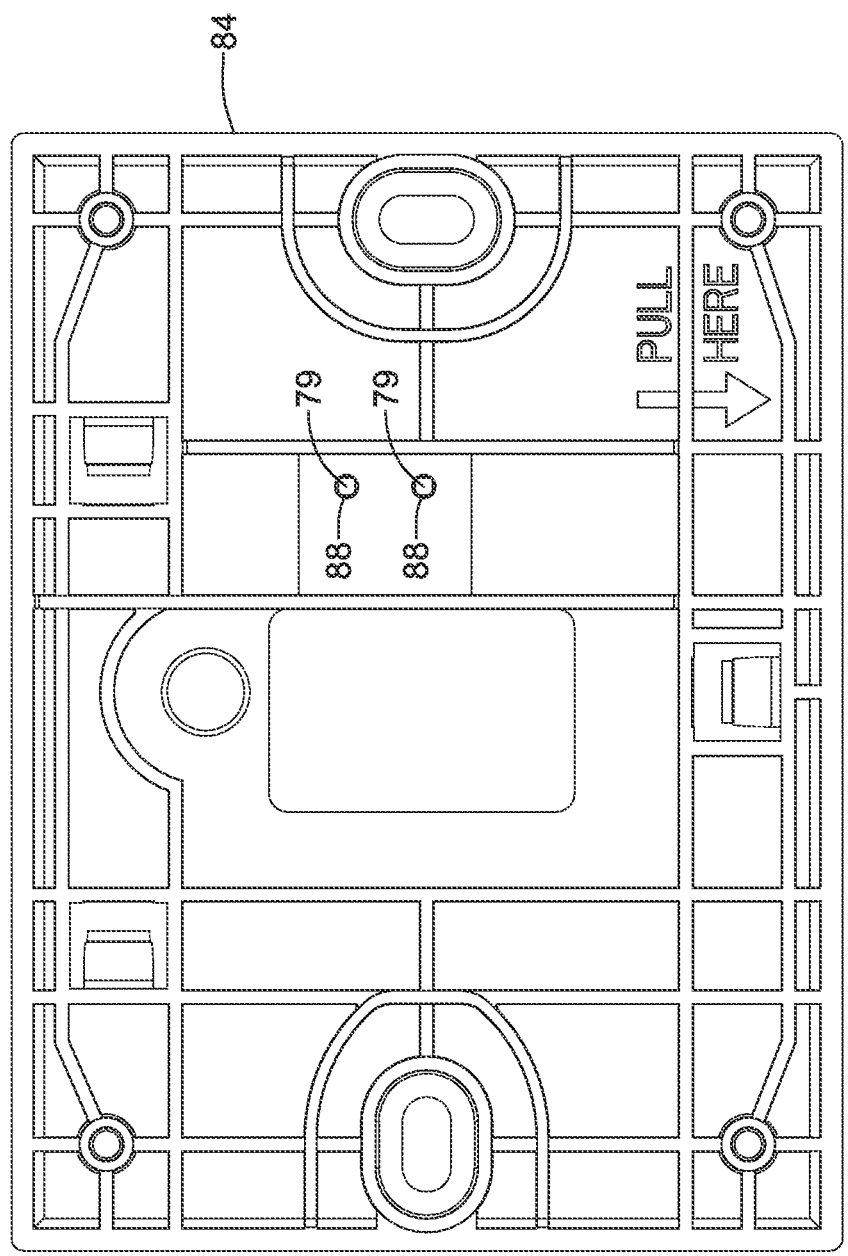
FIG. 34B is a schematic back view of the illustrative wall plate of FIG. 34A.
Figure 35:
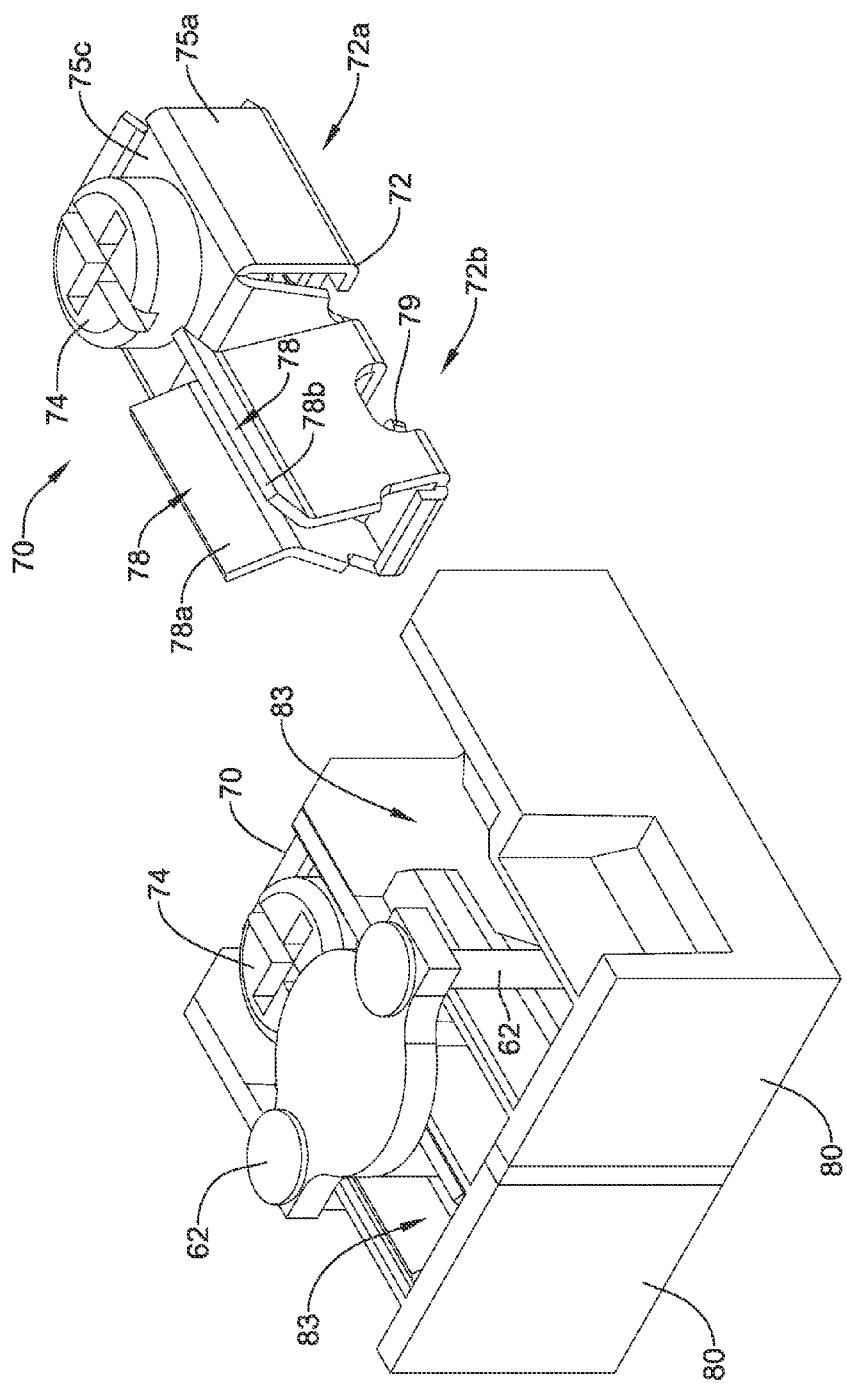
FIG. 35 is a schematic partially exploded view of an illustrative screw terminal of an illustrative electronic assembly.

Electronic assemblies 10 having an LCD 32 may need robust electrical connection(s) for bringing AC power thereto. As shown in FIGS. 34A and 34B, the terminals or terminal blocks 70 may be built into a wall plate 80 or other feature of the electronic assembly 10. Illustratively, the terminals 70 (e.g., one terminal 70, two terminals 70, as shown in FIG. 24, or more terminals 70) may be positioned within the wall plate 80 such that when the housing 12 of the electronic assembly 10 is attached to the wall plate 80, pins 62 affixed to the PCB 34 of the PWA 14 (where the pins 62 may be connected to the PCB 34 via a soldering technique or other mounting technique) may electrically connect to the terminals 70. As seen in FIG. 35, in some instances, two terminals 70 may be configured to engage plastic or other material of the wall plate 80 and pins 62 connected to the PCB 34 (not shown) may thereafter engage the terminals 70.

Figure 36:
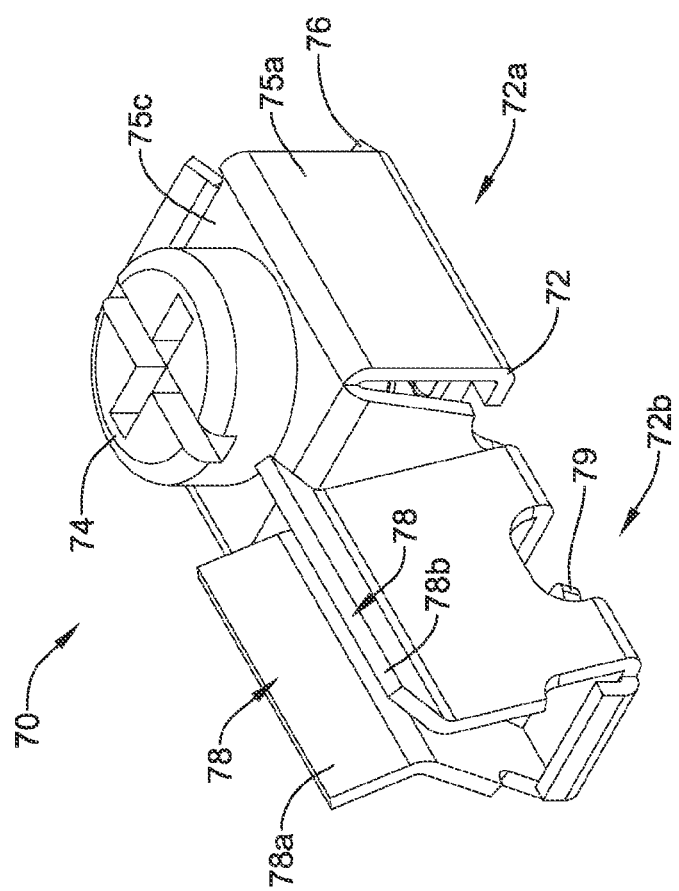
FIG. 36 is a schematic perspective view of an illustrative screw terminal of an electronic assembly.
Figure 37:
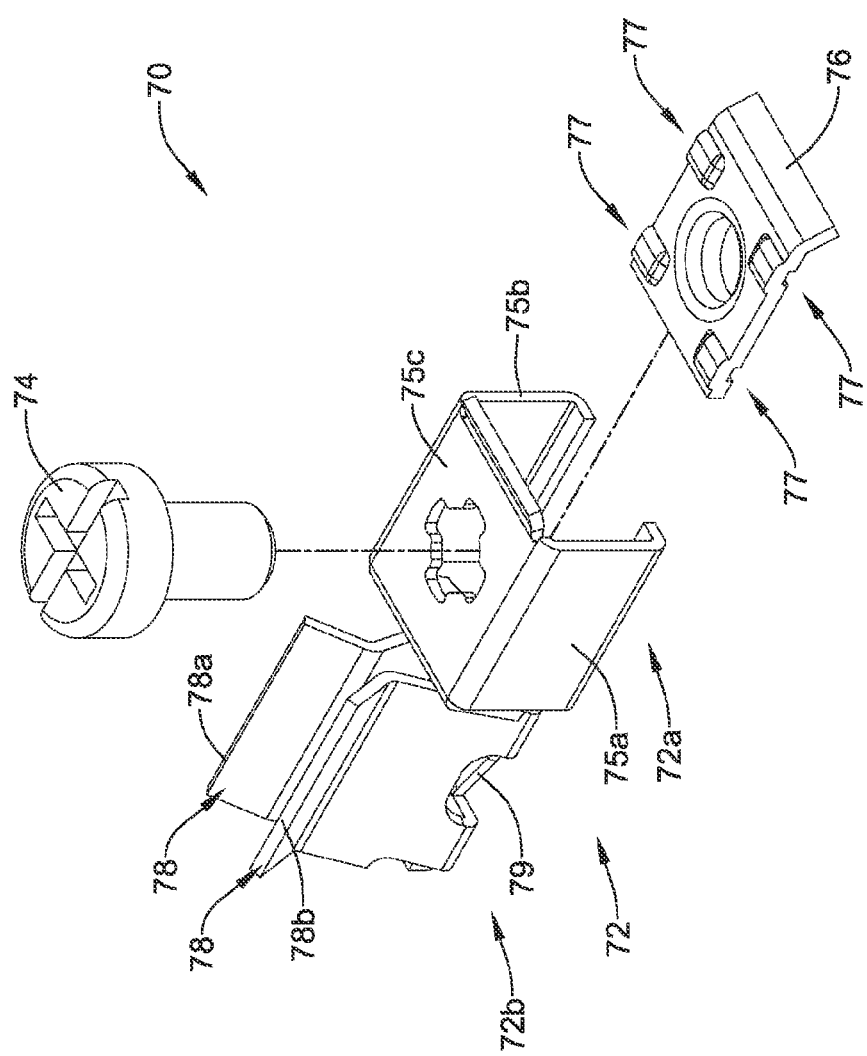
FIG. 37 is a schematic exploded view of the illustrative screw terminal of FIG. 36.
Figure 38:
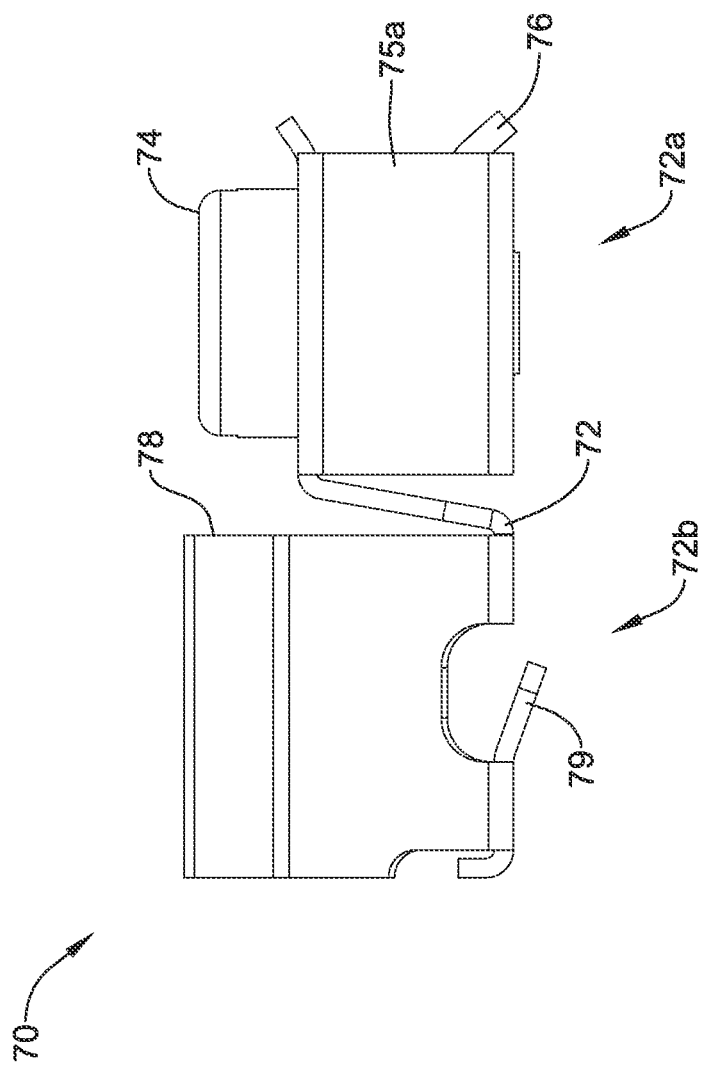
FIG. 38 is a schematic side view of the illustrative screw terminal of FIG. 36.
Figure 39:
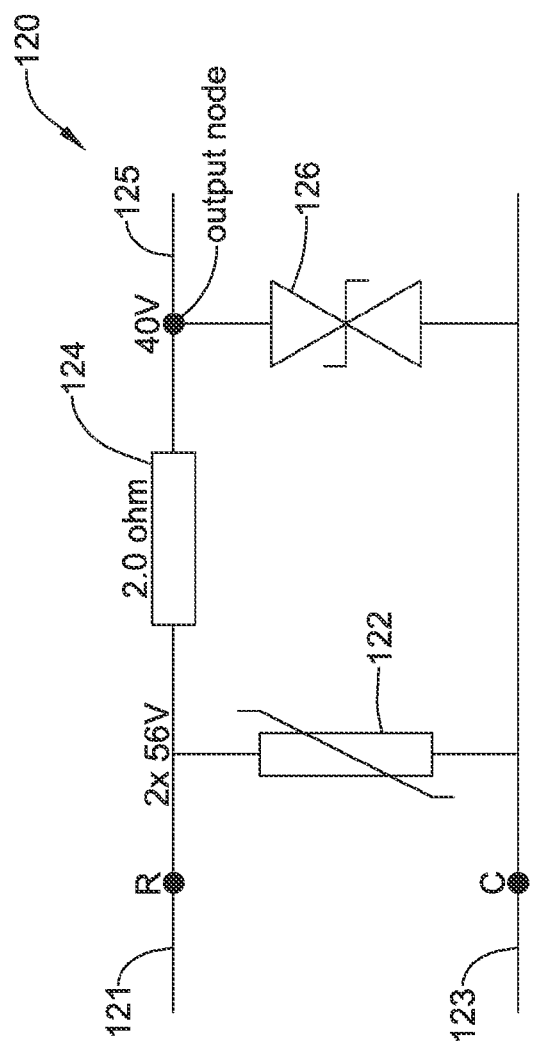
FIG. 39 is a schematic diagram of an illustrative electric circuit an electronic assembly.

Illustratively, the terminals 70 may have a main cage 72 (made of metal or other electrically conductive material), a screw 74, and a nut 76, as shown in FIGS. 36-38. As discussed above, the terminals 70 may be supported by the material (e.g., plastic or other material) of the wall plate 80 and a single terminal 70 may be placed in each of one or more pockets or openings 83 in the wall plate 80.

The cage 72 of the terminal 70 may include a first portion 72a having an area for receiving a screw that may be used for connecting wire to power the electronic assembly 10. Further, the cage 72 of the terminal 70 may include a second portion 72b that may be formed from, or have, two flanges 78 that may be configure to be placed in electrical contact with the pins 62 soldered, or otherwise connected to, the PCB 34 or other feature of the PWA 14. Further, flanges 78 and the second portion 72b of the cage 72 may be configured to fit within openings 83 in the wall plate that are configured to receive the second portion 72b. In some cases, the cage 72 of the terminal 70 may include a one-way latch 79, as best shown in FIG. 38. Illustratively, the one-way latch 79 may be configured to snap into a hole 88 in the wall plate 80, as shown in FIG. 34B, or connect to the wall plate 80 in any other manner. Illustratively, the cage 72 may be formed form any combination of electrically conductive materials. For example, the cage 72 may be formed from phosphor bronze, a phosphor bronze alloy, or other material.

The screw 74 of terminal 70 may be a self-locking screw within the cage 72, where a recess under the screw head and/or special flanges (not shown) extending from the cage 72 may help hold the screw at a desired position. The head of the screw 74 may allow for use with any desired tool. For example, the head of the screw 74 may allow for the use of a flat-head screwdriver, a Phillips head screwdriver (e.g., Phillips PH1, or other Phillips screwdriver), an Allen wrench/hex key tool, or other tool. The screw 74 may be formed from any combination of electrically conductive materials. For example, the screw 74 may be formed from steel, hardened steel, or other material.

The nut 76 may be configured to engage the screw 74 in a threaded manner or a different manner. In some instances, the nut 76 may be completely unscrewed from the screw 74, but due to its positioning within the first portion 72a of the cage 72 the nut may not drop from the terminal 70 and the screw 74 may be engaged by the screw 74 again. Further, as shown in FIG. 37, the nut 76 may include grooves 77 for better fit of wire bringing power to electronic assembly 10. The better fit from grooves 77 may help protect the electronic assembly 10 from unintended wire pull-out when the screw 74 is tightened to nominal torque (e.g., 3.5 lb-in or any other torque level).

The terminal 70 may be placed in one or more of a plurality of patterns to match the pattern of the pins 62 attached to the PCB 34 of the PWA 14 and a nominal pin 62 distance may be configured to be a particular distance (e.g., 7 mm or other distance). In some instances, two pins 62 may be connected to the PCB 34, which may be used to power the electronic assembly with a 24 volt alternate current (AC) or other current, where one wire connected to a terminal may be a ground wire and the other wire connected to a terminal 70 may be live wire (e.g., carrying 24 V AC). As the pins 62 of the electronic assembly 10 are configured to slidingly engage the flanges 78 of the terminal 70 within the wall plate 80, the housing 12 and the contents therein may be removed from the wall plate 80 without disconnecting wires from the housing 12.

In some instances, the electronic assemblies 10 powered from line power transformers may need to be able to withstand surge energy which may come from the power line, through a transformer, to the electronic assembly 10. During surge events, a voltage at a loaded transformer may exceed an absolute maximum rating of power supply voltage for the electronic assembly 10. In other words, the overall energy may be high. To protect the electronic assembly 10 against power surges, suitable over voltage protection components in electrical communication with the pins 62 may be utilized on the PWA 14.

One approach to surge protection may involve splitting a surge voltage. For example, the surge energy may be split and directed to three (or four or more) components. As in the circuit diagram 120 in FIG. 39, a first component may be a small varistor 122 with a high clamping voltage, a second component may be a serial resistor 124, and a third component may be a Transient Voltage Suppressor diode (TVS diode) 126 with a small clamping voltage. In the above example of splitting the surge voltage, the serial resistor 124 may be the component that allows the surge energy to be split to the varistor 122 and the TVS diode 126 in a suitable ratio. Optionally, some part of the surge voltage may be absorbed by a bulk capacitor.

In a more detailed example, typical maximum peak surge current may be around 44 amps (A). Whole protective circuitry may be analyzable as a direct current (DC) circuit powered from 44A current source because energy dissipation is proportional to the actual current value, and the 44A peak current is a worst case scenario. The 44A current may be split on an R node to 15A through a 56V varistor 122 and 29A to the serial resistor 124 and TVS diode 126. Voltage levels between R and C nodes may be limited to the clamping voltage of the varistor 122, which may be 110V, for example. On a serial combination of resistor 124 and a TVS diode 126, a clamping voltage may be defined by the properties of the TVS diode (54V) 126, which may result in a voltage to the resistor of, for example, 110V-54V=56V. Because the 56V is unequivocally defined with differences between the clamping voltage of the varistor 122 and the TVS diode 126, the current through the TVS diode 126 may be unequivocally given by the voltage difference divided by the resistance of the resistor. Although, particular surge protecting schematics are discussed herein and shown in the Figures, other similar and dissimilar circuit layouts may be utilized to protect the electronic assembly 10 from undesirable surges of energy or power.

Those skilled in the art will recognize that the present disclosure may be manifested in a variety of forms other than the specific embodiments described and contemplated herein. Accordingly, departure in form and detail may be made without departing from the scope and spirit of the present disclosure as described in the appended claims.

What is claimed is:
1. A thermostat, comprising:
a housing;
a printed wiring assembly having a ground plane situated in the housing;
a temperature sensor on the printed wiring assembly
a display having a metal backing and situated in the housing, the metal backing having a back surface facing the printed wiring assembly;
an insulative spacer sandwiched between the printed wiring assembly and the display to define a distance between the printed wiring assembly and the display;
a conductive resilient extender, wherein:
the conductive resilient extender is configurable between an original configuration and an articulated configuration, wherein once in the articulated configuration, the conductive resilient extender provides a spring force back toward the original configuration;
the conductive resilient extender is electrically connected to the ground plane of the printed wiring assembly and extends through an opening in the spacer to the back surface of the metal backing of the display to thereby mechanically contact the metal backing of the display and provide an electrical connection between the ground plane of the printed wiring assembly and the metal backing of the display;

the conductive resilient extender is in the articulated configuration and the spring force of the conductive resilient extender is exerted against the metal backing of the display and the printed wiring assembly; and wherein the spacer extends around an edge of the printed wiring assembly to align the spacer with the printed wiring assembly and to align the opening in the spacer with the conductive resilient extender connected to the printed wiring assembly.

2. The thermostat of claim 1, wherein:
the conductive resilient extender is a single piece clip having a spring portion and a connector portion;
the spring portion is configured to mechanically contact the metal backing; and
the connector portion is configured to be mechanically connected to the printed wiring assembly.

3. The thermostat of claim 2, wherein a top of the spring portion is configured to extend 2.0-3.0 millimeters from the printed wiring assembly when the conductive resilient extender is in the original configuration.

4. The thermostat of claim 2, wherein the top of the spring portion is configured to extend 1.0-2.0 millimeters from the printed wiring assembly when the insulative spacer is sandwiched between the printed wiring assembly and the display and the metal backing is acting upon the spring portion to cause the conductive resilient extender to be in the articulated position.

5. The thermostat of claim 2, wherein the spring portion has a contact portion for contacting the metal backing of the display.

6. The thermostat of claim 1, wherein the display includes a touch screen liquid crystal display.

7. The thermostat of claim 1, wherein the conductive resilient extender is mechanically connected to the printed wiring assembly via surface mount technology.

8. The thermostat of claim 1, wherein the conductive resilient extender includes phosphor bronze.

9. A heating, ventilation, and air conditioning (HVAC) controller, comprising:
a housing;
a surface of a printed wiring assembly (PWA) situated inside the housing and electrically connected to a grounding feature;
a touch screen display in the housing and spaced from the surface of the printed wiring assembly (PWA) by a spacer;
a one-piece electrical connector having a first portion soldered to the surface and a second portion extending away from the surface and toward the spaced touch screen display;

the second portion of the electrical connector is configured to spring with respect to the first portion of the electrical connector; and
the second portion of the electrical connector is mechanically in contact with the touch screen display and exerts a spring force against the touch screen display.

10. The HVAC controller of claim 9, wherein the electrical connector forms an electrical connection between the grounding feature and the touch screen display.

11. The HVAC controller of claim 9, wherein the spacer is situated between the surface and the touch screen display and defines a distance between the surface of the printed wiring assembly (PWA) and the touch screen display, wherein the electrical connector extends through an opening through the spacer.

12. The HVAC controller of claim 9, wherein the first portion of the electrical connector and the second portion of the electrical connector are integrally formed.

13. The HVAC controller of claim 9, wherein the touch screen display includes a liquid crystal touch screen display having a metal backing, wherein the second portion of the electrical connector makes contact with the metal backing of the liquid crystal touch screen display.

14. The HVAC controller of claim 9, wherein the second portion has a protrusion for contacting the touch screen display.

15. A method of grounding a display of a thermostat to help avoid electrical damage to the thermostat from an Electro Static Discharge (ESD) event, where the display has a metal backing, the method comprising:
electrically connecting a resilient electrical connector to a ground plane of a printed wiring assembly of the thermostat by soldering the resilient electrical connector to a conductive layer of the printed wiring assembly;
providing an insulative spacer between at least part of the metal backing of the display and the printed wiring assembly;
aligning the spacer with the printed wiring assembly by placing one or more spacer side walls of the insulative spacer along at least one side edge of the printed wiring assembly; and
situating the display adjacent the insulative spacer, such that the resilient electrical connector extends through an opening in the insulative spacer from the printed wiring assembly and makes electrical contact with the metal backing of the display, the electrical connector being bent and exerts a spring force against the metal backing of the display, wherein the spring force maintains an electrical connection with the metal backing over a range of spacings between the printed wiring assembly and the display.

16. The method of claim 15, further comprising securing the printed wiring assembly, the insulative spacer and the display together to form a sub-assembly.

* * * * *